US012688996B2

(12) United States Patent
Tiemeijer et al.

(10) Patent No.: US 12,688,996 B2
(45) Date of Patent: Jul. 21, 2026

(54) SYSTEM FOR SENSOR PROTECTION IN ELECTRON IMAGING APPLICATIONS

(71) Applicant: FEI Company, Hillsboro, OR (US)

(72) Inventors: Peter Christiaan Tiemeijer, Eindhoven (NL); Erwin de Jong, Best (NL); Andrei Radulescu, Veldhoven (NL); James McCormack, Eindhoven (NL); Jeroen Keizer, Winterlre (NL)

(73) Assignee: FEI COMPANY, Hillsboro, OR (US)

( * ) Notice: Subject to any disclaimer, the term of this patent is extended or adjusted under 35 U.S.C. 154(b) by 357 days.

(21) Appl. No.: 18/447,144

(22) Filed: Aug. 9, 2023

(65) Prior Publication Data

US 2024/0055222 A1     Feb. 15, 2024

(30) Foreign Application Priority Data

Aug. 9, 2022     (EP) .................................... 22189488

(51) Int. Cl.
H01J 37/26          (2006.01)
(52) U.S. Cl.
CPC ... H01J 37/265 (2013.01); H01J 2237/24507 (2013.01)
(58) Field of Classification Search
CPC .. H01J 37/265; H01J 37/244; H01J 2237/244; H01J 2237/24507; H01J 2237/20292
See application file for complete search history.

(56) References Cited

U.S. PATENT DOCUMENTS

| | | | | |
|---|---|---|---|---|
| 4,831,255 A | * | 5/1989 | Krivanek | G01T 1/16 |
| | | | | 250/397 |
| 5,936,234 A | | 8/1999 | Thomas et al. | |
| 2007/0110319 A1 | | 5/2007 | Wyatt et al. | |

(Continued)

FOREIGN PATENT DOCUMENTS

| | | |
|---|---|---|
| JP | S63148192 A | 6/1988 |
| JP | H01297585 A | 11/1989 |
| JP | H0582078 A | 4/1993 |

(Continued)

OTHER PUBLICATIONS

European Patent Office. Extended European Search Report, for application 22189488.4, dated Jun. 27, 2023, 13 pages.

(Continued)

*Primary Examiner* — David E Smith
(74) *Attorney, Agent, or Firm* — Michael Best & Friedrich LLP

(57)          ABSTRACT

The invention relates to a system for sensor protection in electron imaging applications comprising a beam control device configured to provide a beam signal based on an incoming beam signal, wherein the beam signal comprises an altered beam intensity, wherein the beam control device is further configured to receive a control signal and to activate based on the control signal. The system further comprises a sensor configured to capture the beam signal and to provide a capture signal based on the beam signal, and a control module configured to provide the control signal to the beam control device, to generate an exposure value based on the capture signal and to modify the control signal based on the exposure value.

20 Claims, 6 Drawing Sheets

(56)                References Cited

U.S. PATENT DOCUMENTS

2012/0256085  A1    10/2012  Otten et al.

FOREIGN PATENT DOCUMENTS

| | | | | |
|---|---|---|---|---|
| JP | H06310063 | A | 11/1994 | |
| JP | 2008140723 | A | 6/2008 | |
| JP | 2012221954 | A | 11/2012 | |
| KR | 20160059739 | A | 5/2016 | |
| WO | 9411164 | A1 | 5/1994 | |
| WO | WO-2021038715 | A1 * | 3/2021 | .............. H01J 37/28 |

OTHER PUBLICATIONS

Japanese Patent Office. Notice of Reasons for Refusal for Application No. 2023-129322, dated Sep. 10, 2024 (8 pages with translation).
Brandt, J.C. et al., "Large-Scale Structures in Comet Hale-Bopp," Earth, Moon and Planets, 2002, 90: 15-33.
Gubbens, A. et al., "The GIF Quantum, a next generation post-col. imaging energy filter," Ultramicroscopy, 2010, 962-970.
Krivanek, O.L. et al., "Parallel Detection Electron Spectrometer Using Quadrupole Lenses," Ultramicroscopy, 1987, 22: 103-116.
Krivanek, O.L., "Improved Paralell-Detection Electron-Energy-Loss Spectrometer," Ultramicroscopy, 1989, 28: 118-121.
Scott, J. et al., "Near-simultaneous dual energy range EELS spectrum imaging," Ultramicroscopy, 2008, 108: 1586-1594.

* cited by examiner

SYSTEM FOR SENSOR PROTECTION IN ELECTRON IMAGING APPLICATIONS

CROSS REFERENCE TO RELATED APPLICATIONS

This application claims priority to European Application No. EP22189488.4, filed Aug. 9, 2022, the entire contents of which is herein incorporated by reference.

FIELD

The present invention relates to particle beam imaging, in particular diffraction imaging based on an electron beam. More specifically, the present invention relates to a system for sensor protection in electron imaging applications based on controlling the beam intensity of a beam signal exposed to an imaging sensor.

BACKGROUND

Traditionally, signal dose protection of the imaging sensor can be realized using an optical model to derive a beam intensity at the imaging sensor from lens currents. However, this can be difficult to expand to imaging applications based on diffraction, energy-filtered transmission electron microscopy (EFTEM) and/or electron energy loss spectroscopy (EELS).

Using direct electron detectors (DEDs) can achieve an increased signal-to-noise ratio (SNR) which can be used to reduce the beam intensity to limit damage by the irradiating beam of electrons to the sample. However, DEDs are more likely to cause an overexposure which may permanently increase dark current resulting in a decrease of SNR and a decrease of dynamic range that can result in the imaging sensor being inoperable. A signal dose can relate to an accumulated dose over the life time of the imaging sensor. A short exposure to a high current density can already cause permanent damage.

Direct detectors can be blocked from being used in diffraction mode since direct detectors can be damaged by high peak current projected on the imaging sensor. It can be difficult to guarantee that the maximum local current incident on the sensor is below system safe limits. The system is also at risk due to the possibility of human error, as the operator may forget and/or not correctly place a beam stop, misalign the optics, etc, such that an unforeseen high beam intensity may hit the sensor. This can lead to severe sensor damage after only a few occurrences. Also, when performing alignments in diffraction mode a central beam may move and miss the beam stop. Additionally and/or alternatively, the alignments may even require the central beam to be visible, e.g., for focusing purposes or astigmatism correction where again a full exposure of the central beam may damage the sensor.

SUMMARY

In light of the above, the present invention seeks to overcome or at least alleviate the shortcomings and disadvantages of known electron imaging systems. It is an object of this invention to provide an improved system and method for protecting an imaging sensor from overexposure.

These objects are met by the system and the method of the present invention.

According to a first aspect the invention relates to a system for sensor protection in particle imaging applications comprising a beam control device (BCD) configured to provide a beam signal based on an incoming beam signal, wherein the beam signal comprises an altered beam intensity.

The particles can be charged, preferably the particles are electrons. The system can be an electron microscope, e.g., a scanning electron microscope and/or a transmission electron microscope. The system can be configured to capture a diffraction pattern of a charged particle beam, in particular of an electron beam. Due to the varying intensity of the beam, a beam intensity can exceed a maximum intensity threshold value that a sensor of the system can capture without substantially diminishing a lifetime of the sensor or without causing irreversible damage to the sensor. Therefore, the system comprises a BCD configured to protect the sensor by shielding the sensor from the beam and/or at least reduce a beam intensity to protect the sensor and prevent overexposure.

The BCD can also be configured to protect a specimen by being positioned upstream of a sample and/or specimen. Thus, varying a beam intensity of the initial beam prior to the beam interacting with the sample and/or prior to the beam signal being captured by the sensor. The system can in particular be configured to directly capture a particle beam. Herein, the beam can comprise a high peak current which is projected on the sensor. Typically, such high peak currents, i.e., high beam intensity prevents the use of direct detectors in diffraction mode.

In particular due to a high variance, i.e., dynamic range, of the incoming beam it is beneficial to control the maximum local current, i.e., maximum local beam intensity, that is provided to the sensor. This can ensure that the maximum local current is within safe limits specified by the sensor. The invention provides the advantage that the sensor can be protected from beam intensities exceeding a maximum allowable intensity. Therefore, prolonging the lifetime of the sensor. In diffraction mode it can be advantageous to block part of the beam signal, preferably the central unscattered beam component which typically has the highest beam intensity. Thus, only providing the scattered component of the beam to the sensor. The central beam component can be blocked by a beam stop which can be placed manually or automatically. However, due to system variation or user error the beam stop may not intersect with the propagation trajectory of the central beam component, thereby allowing the high intensity central beam component to hit and potentially damage the sensor. The system according to the present invention achieves the advantage that such a scenario can be detected and/or foreseen. Thereby, appropriate counter measures, i.e., lowering the beam intensity, can be performed automatically, to protect the sensor.

System variations can include the operator not inserting or removing a beam stop, alignment changes of the beam optics, changes of the sample, i.e., deterioration and/or exchange of the sample.

Providing the beam signal based on the incoming beam signal can also comprise not providing any part of the beam to the sensor such that the sensor is completely shielded from the beam. Alternatively, the BCD can reduce a beam intensity of the incoming beam signal to a reduced beam intensity in the beam signal which can then be provided to the sensor. The Beam intensity can be varied by partial absorption, partial blocking and/or temporally varied blocking of the incoming beam signal.

Typically, when performing alignments in diffraction mode a central component of the incoming beam signal may jump around and miss the beam stop. Furthermore, alignments of the system may be performed with the central beam visible to the sensor, e.g., for focusing purposes or astigmatism correction.

To avoid damage to the sensor, the beam current can be slowly increased, preferably by using a shutter modulation concept. As a first step, images can be acquired at a low beam duty cycle. The system can be configured to determine if the maximum current is, then acceptable the duty cycle is increased to full duty cycle.

The invention can further achieve the advantage that a varied beam signal, i.e., the modulated beam current, can be low enough to allow for longer-term exposure by the sensor. This can be used for alignment purposes.

The altered beam intensity can be based on a temporally varied intensity and/or a temporally varied intensity pattern, in particular a. blocking pattern.

The sensor can be a CMOS sensor comprising a plurality of sensitive elements, also referred to as pixels, in the form of photo diodes arranged in an array. Each pixel can be connected to an Analog-to-Digital Converter (ADC). The voltage over each pixel can be a result of impinging radiation, such as electrons and/or light.

The system can realize a reactive dose protection. For every new optics setting (e.g., after a switch of magnification or a mode switch, i.e., a switch to diffraction or to EFTEM, the system can perform a peek at the image to check that the dose is safe. This peek can comprise a reduced exposure, preferably minimal beam intensity to produce an image. The system can determine safe exposure conditions based on this peek and initiate a further longer peek to check that it is still safe. This peeking can be continued until a requested exposure time is reached.

Preferably, the system can generate short exposure times such that the sensor is not overexposed, i.e., an exposure threshold value is exceeded at a beam intensity maximum and expoure time minimum, i.e., shortest inactive interval.

The BCD can comprise a shutter made of Titan. The BCD can comprise a shield configured to surround the shutter and to shield the shutter from EM-radiation, respectively to shield the surrounding from EM-radiation emitted by the BCD. In particular, the shielding can be a shielding bush. The shielding bush can comprise mu-metal and/or ferrite. Preferably, the BCD is configured to realize an exposure time interval of 10 μs or below. An exposure time interval can be defined as a time interval between the BCD deactivating and the BCD activating again, i.e., performing two switching actions.

Method

Generally, a trigger, e.g., a significant optical mode change, switching to diffraction mode etc., can cause the system to enter an evaluation mode, i.e., peeking mode, during which the system will check if illumination is acceptable. After this check is performed a regular exposure mode can be performed. Preferably, a dose protection is active during the regular exposure mode which can activate when an exposure threshold value is reached or exceed to then limit the exposure of the beam signal to the sensor.

The beam current can be slowly increased by using a BCD-, i.e., shutter-modulation concept. First images are acquired at a first duty cycle with a reduced exposure time interval. The system can determine the detected maximum current for the reduced exposure and increase to a full duty cycle when the maximum detected current per exposure is below a respective threshold value.

The modulated beam current can comprise a beam intensity that is low enough to allow for longer-term exposure of the sensor, e.g., for alignment purposes.

The BCD can vary an intensity of the beam signal over a predetermined time interval. Thus, the beam intensity can be modulated, in particular to reduce an overall exposure of the beam signal to the sensor in a capture interval. The exposure of the beam signal to the sensor per capture interval can be limited by the BCD.

The system can comprise a sensor configured to capture the beam signal, in particular the modified beam signal and/or the incoming beam signal, and to provide a capture signal based on the beam signal. The sensor can provide a quantitively, spatially and/or temporally resolved representation of the beam signal as part of the capture signal. Preferably the sensor is directly exposed to the beam signal, in particular in a diffraction mode of the system. The beam signal can be an incoming electron beam directed at the sensor. The electron beam can be scattered off a sample and/or the electron beam can be diffracted by a sample in the beam path.

The BCD can comprise a blanker configured to stop the incoming beam signal from propagating past the blanker in the initial propagation direction of the incoming beam signal when activated. The beam signal can be absorbed by the blanker. The blanker may not influence the incoming beam signal in a deactivated state.

The BCD comprises a mechanical shutter, configured to provide a switchable physical barrier when activated which is configured to at least partially intersect the initial propagation direction of the incoming beam signal. The BCD can modify the incoming beam signal such that the beam signal captured by the sensor may comprise artifacts.

In particular, the BCD may smear out parts of the incoming beam signal such that an intensity peak can be projected onto a plurality of detector wells, i.e., pixels of the sensor. This can improve the detection of an overexposure as the beam signal may not only overexpose a single pixel but a plurality of pixels. A single overexposed pixel may be interpreted as a malfunctioning pixel, wherein a group of overexposed pixels is easier to detect as a significant overexposure. This effect can occur due to a slower activation of the BCD (in reference to a faster capture rate of the sensor), i.e., the BCD moving into the beam such that, for example, refraction occurs at an edge of the BCD.

At short exposure times the image will not be ok because of the slow shutter (magnetic) but this does not matter for over exposure detection. It can even be an advantage because the dose is smeared out and is easier to detect. A true local (within a pixel) over exposure may not be detectable with an area filter detection method but it will cause severe damage.

The BCD can comprise an electrostatic shutter, configured to provide an electrostatic field when activated such that the initial propagation direction of the incoming beam signal and a modified propagation direction of the modified beam signal are angled with respect to one another, in particular when the electrostatic shutter is active. This achieves the advantage that the beam signal with the modified propagation direction can deflected such that the modified beam signal at least partly does not reach the sensor. Preferably, the modified beam signal does not propagate towards the sensor when the electrostatic shutter is active. The electrostatic shutter can be configured to deflect the incoming beam signal towards an absorption target configured to absorb the incoming beam signal.

The BCD can comprise an electromagnetic (electrodynamic) shutter, configured to provide an electromagnetic filed, in particular a periodic electromagnetic field, when activated such that the initial propagation direction of the incoming beam signal and a modified propagation direction of the modified beam signal are angled with respect to one another, in particular when the electromagnetic shutter is active. Thereby, the beam signal can be directed away from the sensor, in particular to protect the sensor from damage due to a beam intensity exceeding the tolerances of the sensor.

The BCD can comprise an attenuator, configured to lower an intensity of the incoming beam when activated to provide a modified beam having a substantially equal intensity as the incoming beam signal or a lower intensity than the incoming beam signal. Preferably, the attenuator can comprise a transmissive material configured to transmit part of the incoming beam signal as the beam signal towards the sensor. Thereby, the beam intensity can be lowered. This can achieve the advantage of avoiding an overexposure and/or reducing the beam intensity to a predetermined level. The attenuator can be adjustable such that a transmissivity can be controlled. A substantially equal intensity can be achieved in a specific mode of the attenuator that maximizes transmissivity such that the beam signal provided to the sensor is only minimally altered in reference to the incoming beam signal. This can be a pass-through mode to provide an essentially unaltered beam signal to the sensor.

The BCD can comprise an aperture, configured to block at least part of a cross section of the incoming beam signal when activated. The aperture can intersect at least partially with the incoming beam signal such that the beam signal provided to the sensor comprises a modified beam cross section. The aperture can block parts of the beam that contribute to an overexposure of a at least a subarea of the sensor. Consequently, adjusting the aperture can prevent an overexposure and/or sensor damage.

The BCD can comprise a lens, configured to transform the cross section of the incoming beam when activated. The lens can be a specific type of a focus/defocus element with corresponding features and advantages. The lens can be an electrostatic or an electromagnetic lens configured to converge the incoming beam signal. The lens can be nested in further lens elements. The sample can be placed within the lens.

The BCD can comprise a mirror configured to at least partially reflect and/or deflect the incoming beam signal when activated. The mirror can be semipermeable such that part of the beam signal may reach the sensor. An incline of the mirror can be adjustable to modify the propagation direction of the reflected beam signal. The transmissivity of the mirror can be adjustable to control the intensity of a transmitted component of the incoming beam signal directed at the sensor. The mirror can be configured to at least partly direct the incoming beam signal onto an absorption target and/or to other components of the system. In particular, the mirror can be configured as a beam splitter to provide the beam signal to a plurality of detector sources.

The BCD can comprise a focus element configured to focus and/or defocus the incoming beam signal when activated, in particular by increasing and/or decreasing the cross section of the incoming beam at an imaging plane. An overexposure at the sensor can also be mitigated by defocussing the incoming beam signal such that the beam intensity is spread over a larger number of capture sites of the sensor. For example, a focussed high spot at the sensor can lead to an overexposure of a small number of pixels.

Defocussing the incoming beam signal can extend the area of high intensity components of the beam such that the beam intensity levels are below a threshold value mitigating an overexposure. The lens can be configured to adjust the focal point of the beam in relation to the sensor. The lens can further be configured to completely defocus the beam as an emergency measure such that either no parts of the incoming beam signal that would lead to an overexposure reach the sensor and/or such that these parts are defocussed to such a level, that safe beam intensities reach the sensor.

The BCD can comprise a beam splitter configured to transmit a first part of the incoming beam signal to the imaging plane and to transmit a second part of the incoming beam signal towards a second imaging plane when activated, wherein a surface-normal of the imaging plane and a further surface-normal of the second imaging plane are angled with respect to one another. The beam splitter can be configured to divide an incoming beam signal into at least two beam components. Thus, a partial beam with a lower intensity can be generated. The beam splitter can be configured to vary the intensity ratio of at least two split beam components. The beam splitter can be configured to direct at least one of the split beam components towards the sensor. The beam splitter may be used to reduce an intensity of the incoming beam signal.

The BCD can comprise a slit configured to shape the cross section of the incoming beam signal when activated, in particular by partially blocking the incoming beam signal. The slit can comprise an adjustable opening or a plurality of adjustable openings. Thus, part of the incoming beam signal can be blocked. Furthermore, the incoming beam signal can be diffracted at the slit.

The BCD can comprise a beam chopper configured to modify the beam intensity profile over a time interval when activated. The beam chopper can be configured to periodically block the propagation of the beam signal from propagating towards the sensor. The frequency and/or ratio of blocking top non-blocking intervals can be controlled. The beam chopper can be configured as a means to implement a pulse width modulation of the beam signal.

The System can comprise a motion component, configured to move the BCD relative to the initial propagation direction of the incoming beam signal. This achieves the advantage that the BCD can be positioned such that an effect of the BCD regarding an exposure of the sensor by the beam signal can be optimized. For example, a beam stop can be positioned such that overexposing components of the beam or stopped from propagating towards the sensor. The motion component can be included in a control mechanism wherein a position of the BCD can be controlled based on the capture signal. The motion component can be configured to move the BCD independently, i.e., not in relation with a mechanism configured to activate/deactivate the BCD.

The motion component can be configured to translate and/or to rotate the BCD into an active position enabling the BCD to provide the modified beam signal and/or to translate and/or rotate the BCD into an inactive position disabling the BCD from providing the modified beam signal.

The BCD can receive a control signal and activate and/or deactivate based on the control signal. Thus, the BCD can be controlled automatically. Preferably the control signal can not only be generated based on a user input but also automatically based on exposure conditions at the sensor and/or general system parameters, i.e., changes in the alignment of the system.

The BCD can activate for the duration of an active interval and/or to deactivate for the duration of an inactive interval. This achieves the advantage that the BCD can be in a controlled state of activation or deactivation. Any deviation from these states can trigger additional safety measures. The BCD can have a default state, i.e., active to protect the sensor wherein the deactivation of the BCD can require an active control signal and/or a periodic input to keep the BCD in the deactivated state.

The control signal can comprise a control interval having an active interval and/or an inactive interval. A continuous sequence of control intervals can be provided to the BCD to control the status (active/inactive) of the BCD, in particular control the status continuously. The control interval can comprise a plurality of active intervals and a plurality of inactive intervals.

The active interval and the inactive interval can form a periodic signal. This achieves the advantage that a consistent, i.e., at least for a predetermined time interval not changing, beam signal can be provided to the sensor. Thereby, an exposure of the sensor can be estimated based on an initial exposure value determination at the beginning of such a predetermined time interval. Preferably, each capture interval of the sensor comprises at least one active interval and one inactive interval when the BCD is active.

The BCD can receive a control parameter and adjust an interaction with the incoming beam signal based on the control parameter. Based on the control parameter, the BCD can supersede any beam intensity modulation by the control signal. The control parameter can indicate the BCD may not execute any inactive intervals. The control parameter can be used as an emergency measure to protect the sensor.

The BCD can modify a beam property of the incoming beam signal based on the control parameter. A beam property can be any physical property of the beam signal, e.g., a phase, polarization, amplitude, particle speed distribution, particle energy distribution, particle composition. Preferably, any beam characteristic that contributes to a beam intensity at the sensor may be adjustable by the BCD.

The BCD can receive a block signal and prevent the incoming beam signal from further propagating in the initial propagation direction past the BCD based on the block signal. The block signal may supersede the control signal. In particular, the block signal may not be tied to a capture interval. The BCD can be configured to initiate a continuous or intermittent block of the beam signal based on the block signal. The activation of the BCD based on the block signal can achieve the advantage that a time delay between an event triggering the block signal and an activation of the BCD based on the block signal can be minimized. Thus, a time interval during which the sensor is exposed to a potentially harmful beam, i.e., a beam with a harmful intensity pattern, can be advantageously reduced.

The control signal can comprise a timing parameter, and wherein the BCD is configured to activate and/or to deactivate based on the timing parameter. This can achieve the advantage that activating/deactivating the BCD can be synchronized with other components of the system, in particular synchronized with a capture interval, capture rate and/or shutter frequency of the sensor. Furthermore, the BCD can be configured for a timed activation based on the timing parameter such that a relative or absolute timing with regard to timing specifications, e.g., the capture interval, of the sensor can be achieved. This can achieve the advantage that a ratio of blanking out the beam versus exposure of the beam to the sensor can be varied, in particular varied with reference to the sensor and or the framerate of the sensor. The timing parameter can control a synchronous or asynchronous operation of the BCD with reference to the sensor.

The system can comprise a secondary BCD configured to receive an emergency block signal and to prevent the incoming beam signal from further propagating in the initial propagation direction past the secondary BCD based on the emergency block signal. The secondary BCD can realize a further safety measure to protect the sensor, in particular when measures to reduce a beam intensity based on the BCD are insufficient or fail to reduce an overexposure or other critical conditions at the sensor. The emergency block signal may supersede the control signal and/or the block signal to prevent damage to the sensor. The secondary BCD can be configured to move the sensor out of the trajectory of the beam signal, e.g., tilt the sensor backwards. Additionally and/or alternatively, the secondary BCD can comprise an electromagnetic, electrostatic or mechanical beam stop configured to stop propagation of the beam towards the sensor. The secondary BCD can be configured to activate when the BCD fails and/or exposure values do not change despite the BCD being activated.

The secondary BCD can be structurally identical to any of the above-described embodiments of the BCD.

The secondary BCD can be placed upstream or downstream of the BCD in reference to the direction of the incoming beam signal. By positioning the secondary BCD upstream of the BCD, sample and/or beam optics the secondary BCD can also prevent damage to these components when beam intensities outside of the maximum specifications of the respective components and/or samples are detected.

The system can comprise a control module configured to provide the control signal and/or the block signal to the BCD and/or to provide the emergency block signal to the secondary BCD. The control module can be configured to automatically control the BCD and/or secondary BCD based on a capture signal provided by the sensor.

The control module can generate an exposure value based on the capture signal and modify the control signal, in particular the control interval, based on the exposure value. This achieves the advantage that the control module can evaluate the exposure of the sensor and/or determine a degradation of the sensor based on the captured beam signal. The control module can adjust the control signal to decreases degradation, in particular while also providing a capture signal with a maximized dynamic range, resolution and/or signal-to-noise-ratio. In particular capture signal artifacts caused by high beam intensities can be mitigated. The exposure value can represent a measure of exposure of a full detector area of the sensor and can serve as an indicator for overexposure. The exposure value can also be based on a subsection of the sensor, in particular a subsection comprising the highest brightness levels of the respective capture signal.

The control module can decrease the active interval while the exposure value does not exceed an upper threshold value, in particular a maximum safe exposure value. This achieves the advantage that an exposure interval per capture interval of the sensor to the beam signal can be increased while the sensor is operated within safe beam intensity levels. In particular, the exposure value can be determined such that no area of the sensor is subjected to detrimental overexposure. The control module can start with a maximum active interval with a minimum exposure interval and decrease the active interval for each subsequent frame until a set exposure value is reached and/or until the sensor can be exposed to the beam for a full capture interval, i.e., the BCD is inactive for the complete duration of a capture interval, and the exposure value is below a maximum safe exposure value.

The control module can increase the active interval and/or decrease the inactive interval when the exposure value exceeds the upper threshold value, and/or decrease the active interval and/or increase the inactive interval when the exposure value falls below a lower threshold value, in particular a minimum detection exposure value. Thus, the control module can automatically control the exposure of the sensor to an optimal value by activating or deactivating the BCD. Preferably, the BCD does not influence the representation of the beam signal by the capture signal other than reducing a beam intensity and thereby a captured brightness at the sensor. The upper threshold value can be based on physical limitations of the sensor and/or on predetermined lifetime expectations of the sensor which can scale according to the beam intensity the sensor is exposed to.

The control module can adjust the control interval such that the control interval comprises active intervals during which the BCD is to be active and inactive intervals during which the BCD is to be inactive and wherein the control module is configured to modify the ratio of active intervals to inactive intervals based on the exposure value. This achieves the advantage that the control module can also vary the number of active intervals and inactive intervals during a capture interval. Thus, a beam exposure to the sensor can be spread over whole capture interval, can be concentrated at the beginning of the capture interval or can be concentrated at the end of the capture interval.

The control module can increase each active interval when the exposure value exceeds an upper threshold value and/or decrease each active interval when the exposure value falls below a lower threshold value. The set limits can differ from maximum safe exposure values or lower detection limit values. Thus, the control module can compensate a varying beam intensity such that capture signal may comprise comparable brightness. In other words, the control module may operate the BCD such that an automatic exposure with substantially constant brightness values can be achieved. The active intervals can form a set of intervals each having a specific length. The control module can then increase or decrease each active interval homogeneously such that, for example, a frequency of active intervals within a capture interval remains constant.

The control module can decrease each inactive interval when the exposure value exceeds an upper threshold value and/or increase each inactive interval when the exposure value falls below a lower threshold value. Similarly to the control of active intervals, the control module can vary the length of inactive intervals based on the exposure value.

The control module can adjust an interval duration of active intervals and a further interval duration of inactive intervals such that an interval frequency remains constant. Alternatively, an interval pattern can remain constant. For example, a specific sequence of active and inactive intervals can be adjusted such that the relative length of the intervals within the sequence remain the same with respect to one another.

The control module can provide the control signal continuously to the BCD or provide the control signal to the BCD when the control signal changes.

The control module can control the interval frequency based on the exposure value to match the exposure value to a predetermined base exposure value. This can achieve the advantage that the capture signal can comprise a predetermined contrast and/or brightness and thus increase the level of detail perceivable by an operator. In particular, a visual representation of the capture signal can show beam signal characteristics more clearly. The predetermined exposure value can also be based on the specification of the sensor such that the predetermined base exposure value decreases the risk of damaging the sensor or increases the chance to prolong the lifetime of the sensor.

The control module can adjust the control interval based on a capture frequency of the sensor. This can achieve the advantage that a capture frequency can be synchronized with the control interval to reduce or eliminate an interference of the capture frequency and an active interval frequency which could produce an uneven exposure of subsequent capture intervals, e.g., produce a perceivable flicker.

The control module can modify the interval duration of the active intervals and/or the further interval duration of the inactive intervals at a frequency smaller than or equal to the capture frequency. This can achieve the advantage that an interval duration may not change within a single capture interval. Preferably, the modification of the interval duration occurs at integer multiples of the capture frequency and/or preferably at the seam of two capture intervals and/or in between two capture intervals.

The control module can enter a limit mode when the exposure value exceeds a predetermined limit threshold. Within the limit mode the beam signal can still be captured by the sensor such that a capture signal can be provided to analyse the beam signal. When switching from the previous mode, e.g., a normal operation mode, to the limit mode the active interval can be increased. The predetermined limit threshold can be lower than a maximum safe exposure value such that providing a capture signal remains possible as the control interval may still comprise an inactive interval. The limit mode can be preventive active measure to ensure protection of the sensor. The limit mode can be a reactive mode and can be advantageous when an exposure value gradient is too high such that the maximum safe exposure value may be exceeded within a capture interval. Such a capture interval may already damage the sensor. Consequently, the limit mode can represent an additional safety measure in conjunction with the evaluation mode.

The control module can apply a pulse width modulation (PWM) to the control interval to control an average beam intensity of the modified beam signal during the control interval. Using the PWM the sequence of active and inactive intervals, in particular within a capture interval may be varied. Each capture interval sums the number of intervals during which the beam signal is exposed to the sensor. A PWM base frequency may be higher than the capture frequency, preferably at least twice the capture frequency. The PWM can achieve the advantage of decoupling the exposure value from the capture interval length. The PWM can be controlled such that the type of BCD is taken into account to eliminate or at least minimize beam signal distortion by the BCD. The average beam intensity can be defined as the summed beam intensity the sensor is exposed to during a single capture interval.

The control module can adjust the PWM of the control interval, in particular to control the averaged beam intensity to achieve a predetermined exposure value, particularly a maximum safe exposure value. This can achieve the advantage of capturing the beam signal such that the capture signal comprises a representation of the beam signal spread over a plurality of brightness levels. In particular, the highest intensity regions can be mapped to the highest brightness level, i.e., a maximum safe exposure value such that the dynamic range to capture the beam signal can be maximized.

The control module can apply a duty cycle limit control to the control interval to limit a beam intensity during a capture interval of the beam signal by the sensor. The capture interval can be defined based on the sensor. The sensor can be configured to acquire a plurality of capture intervals within a single read-out of the sensor. The number of capture intervals available with a single read-out can depend on the exposure value. The duty cycle can be the active interval when the BCD is active. Hence increasing the duty cycle can decrease the beam intensity, respectively the exposure value.

The control module can adjust the duty cycle of the control interval, in particular to control the beam intensity to achieve a predetermined exposure value, particularly a maximum safe exposure value.

The control module can enter an evaluation based on a trigger signal. The evaluation mode can be defined as a mode where the maximum beam intensity is to be determined while reducing the risk to damage the sensor. The evaluation mode can be triggered based on changes of the detected beam intensity. In particular, the control module can be configured to trigger the evaluation mode based on an increase in beam intensity, an increase in a beam intensity gradient over time, an increase of a spatial gradient of the beam intensity (i.e., the beam is focussed onto the sensor), an increase in variation of the beam intensity (i.e., the beam intensity becomes unstable), a shift in the captured beam pattern (e.g., based on a disturbance to the system) and/or an ambient disturbance to the system (e.g., a change in temperature, humidity, pressure, vibration levels). The evaluation mode can also be triggered manually, periodically or as a maintenance measure. The control module can receive the trigger signal. The evaluation mode can precede any regular operation mode of the system. The evaluation mode can also be active while capturing the beam signal.

A first exposure interval can be ½₅₀ s comprising a beam exposure of, e.g., 10 ms. If the exposure is ok the exposure time can be doubled until full exposure is reached. For each iteration the capture signal can be checked for overexposure. The evaluation mode can be aborted and the BCD can remain active when an overexposure is detected.

At exposure times below an artifact threshold value, the image may comprise artifacts due to the BCD activating and/or deactivating. These artifacts may not be relevant to detect an overexposure. The artifacts can be an advantage as the beam signal is smeared out and can be easier to detect. In particular, a local (e.g., within a pixel) overexposure can be below a detection threshold and thus may not be identified as an overexposure but may still cause sensor damage.

The exposure time of the sample and the exposure of the sensor can be equal. In comparison to other imaging modes, diffraction imaging can be performed with a reduced beam intensity to observe the diffraction pattern. This can be due to an inhomogeneous distribution of the electrons compared to other imaging techniques. Therefore, it can be advantageous to decouple exposure time of the sample from the capture interval of the sensor. Thereby, the sample can be protected, in particular during orientation and can also limit the number of electrons hitting the sensor.

The control module can set a control interval comprising a predetermined maximum active interval and/or comprising a minimum inactive interval. A maximum active interval can fill a capture interval. A minimum inactive interval can be zero in length. The limits can be set according to a determined exposure value. Preferably the beam signal can thus still be captured at the maximum active interval, i.e., the capture signal comprises a representation of the beam signal.

The maximum active interval may provide a maximum of a possible beam intensity increase that can still be captured by the sensor without exceeding a maximum safe exposure value.

The control module can incrementally increase the inactive interval per capture interval and/or incrementally decrease the active interval per capture interval, in particular for a subsequent series of capture intervals. This achieves the advantage that an initial capture interval can be based on a beam signal having an initial beam intensity. The initial beam intensity is preferably below a maximum beam intensity the sensor can capture without suffering major degradation or damage. The initial beam intensity can be high enough such that the beam signal can be registered in the capture signal, i.e., the beam intensity is above a detection threshold of the sensor. The control module can determine an exposure value difference between subsequent capture intervals and base an increase rate on the exposure value difference. This can achieve the advantage that a number of capture intervals in an evaluation mode required to determine whether the current beam intensity is within predetermined parameters, i.e., the beam intensity is low enough to allow a full exposure of the beam to the sensor for a capture interval, can be minimized. The incremental increase of the inactive interval can be based on the increase rate of the exposure value of captured intervals such that the number of incremental increases to reach a target interval ratio or exposure value can be decreased.

The control module can apply PWM to the control interval to limit the exposure value and to incrementally increase the number of active intervals and/or the duration of active intervals per capture interval. An incremental increase in the number of active intervals can realize a stepwise reduction in exposure value. Thus, with increasing beam intensity the exposure value can be kept constant. Furthermore, the PWM can be applied to control interval sections not comprising any active intervals. Thereby, the remaining structure of inactive intervals and active intervals can remain constant and the inactive interval sections are modulated by the PWM. Alternatively or additionally to increasing the number of active intervals also the length of active intervals can be increased. The exposure value can also be controlled such that an exposure value gradient over a consecutive set of capture intervals can be achieved. The active interval pattern can be adjusted according to device parameters of the BCD. In particular, based on a switching time, a wear per switch (i.e., mean time before error), a switch delay (i.e., time it takes to switch from an active state to an inactive state and/or vice versa), a trigger delay (i.e., begin of switching once a switch is indicated by the control signal) and/or an intensity gradient during a switching action (i.e., the speed of which the beam intensity at the sensor can be reduced. Thus, the lifetime of the BCD and/or the sensor can be increased and/or the switching cycle can be optimized.

The control module can determine an increase of the exposure value per capture interval with reference to a previous capture interval. This can serve as a basis to determine exposure value increased for upcoming capture intervals. Additionally, an exposure value gradient over a set of capture intervals can provide an estimate on when a maximum safe exposure value may be reached or exceeded (i.e., taking the planned capture intervals into account, determining the number of capture intervals when the exposure value would be equal or above the maximum safe exposure value.

The control module can exit the evaluation mode when a difference of the current exposure value and the maximum safe exposure value is smaller than a projected increase of the exposure value in a subsequent capture interval. This achieves the advantage that an overexposure, i.e., exceeding the maximum safe exposure value or a set exposure value below the maximum safe exposure value can be avoided. This can contribute to increasing the life time of the sensor. Exiting the evaluation mode can be defined as keeping an exposure value and/or control interval constant for subsequent capture intervals. When exiting the evaluation mode the system can return to a regular capture mode with set parameters. The set parameters can be adjusted according to the exposure values determined in the evaluation mode. For example, the time interval the beam signal is exposed to the sensor can be smaller than a set time interval to protect the sensor.

The control module can exit the evaluation mode when a determined exposure value falls below the maximum safe exposure value and/or the control interval comprises a predetermined ratio of active intervals to inactive intervals, preferably the control interval comprises an inactive interval only. This can achieve the advantage that the capture of the beam signal can be achieved without interruption of the beam signal by the BCD. Alternatively, an interval pattern with favourable optical properties, i.e., minimal distortions, minimal imaging artifacts, in particular in reference to sensor properties can be achieved and/or maintained.

The control module is configured to maintain the control signal with a control interval comprising a pattern of active intervals and inactive intervals corresponding to the last exposure value determined in the evaluation mode. This can achieve the advantage that the evaluation mode can be used to determine a specific control interval corresponding to a predetermined exposure value. Preferably, the evaluation mode can be triggered automatically such that a settings change that may result in an exposure value change and/or that may cause an overexposure is verified to by safe, i.e., not yielding an exposure value above the exposure value threshold, prior to being fully implemented. In particular, the evaluation mode can be configured such that each setting change is implemented as quickly as possible while still adhering to safety standards by setting the predetermined parameter beginning from a safe parameter start value. From that parameter start value a gradient can be applied to reach the predetermined parameter while monitoring the capture signal and/or to avoid exposing the sensor to a beam signal outside set specifications of the sensor or outside of wear parameters thereby causing increased wear on the sensor.

The control module is configured to control the exposure value of a subsequent capture interval, preferably a plurality of subsequent capture intervals, to an exposure value determined in the evaluation mode, in particular determined last in the evaluation mode. This can achieve the advantage of implementing an automatic exposure mode, wherein the exposure value can be controlled, for example, to be constant, to increase according to a predetermined gradient or to be within a specified exposure value range. Controlling the exposure value can comprise setting a determined control interval for each subsequent capture interval, in particular until the evaluation mode is entered again. The control interval may preferably only be changed during the evaluation mode such that an exposure within device safe limits can be achieved.

The control module can adjust the active interval pattern while maintaining the last exposure value determined in the evaluation mode. This can achieve the advantage of adjusting a pattern of the active intervals and inactive intervals such that a switching of the BCD is minimized and/or predetermined switching intervals are maintained. In particular, the control interval can be adjusted such that each inactive interval is shorter than a maximum inactive interval and/or that each active interval is shorter than a maximum active interval.

The control module can transform a PWM active interval pattern to a continuous active interval per capture interval. A plurality of active intervals can be grouped to form a single cohesive active interval which may reduce wear of the BCD and/or improve the quality of the capture signal. Each continuous active interval can be confined to a single capture interval. The PWM mode can be limited to the evaluation mode such that an interval frequency of active intervals and inactive intervals is lower when the evaluation mode is not active. A summed interval ratio of active intervals and inactive intervals can remain constant. Resolution of the active interval length and/or inactive interval length can at least match the PWM frequency resolution. Thus, the exposure time achieved by a set of PWM modulated active intervals, respectively inactive intervals can match an exposure time achieved by a single continuous active interval, respectively inactive interval within one capture interval.

The control module can set an attenuation parameter to control the intensity of the modified beam signal. A BCD configured to stepwise or continuously adjust the beam signal intensity can be controlled by setting the attenuation parameter. The attenuation parameter can correspond to a specific transmissivity to be achieved by the BCD. Thus, the BCD can partly absorb and/or deflect and partly transmit the beam signal. The attenuation of the beam signal can be used in conjunction with adjusting the control interval, in particular using PWM. Additionally and/or alternatively, the BCD can be configured to use PWM to achieve an averaged intensity corresponding to the attenuation parameter.

The control module can increase the beam intensity per capture interval and determine the exposure value for each increase. An increase in beam intensity can be achieved by adjusting the control interval. The exposure value can be tracked such that the control module can perform an evaluation of the most recent increase against predetermined parameters and to either exit the evaluation mode based on the determined exposure value or to continue the evaluation mode by performing a further increase.

The control module can decrease the active interval such that the beam intensity and/or the exposure value is/are increased by a fixed amount per capture interval. A fixed increase can achieve the advantage of efficiently setting the parameters for the next capture interval. The beam intensity and/or the exposure value may be non-linearly proportional to the time interval of exposure, i.e., the active interval, respectively inactive interval. The fixed amount can be a predetermined absolute value or a predetermined percentage. Increasing by a fixed amount per capture interval can decrease the computation time required to set parameters for the subsequent capture interval, thus may decrease the minimum capture interval length and/or reduce the overall time required to complete the evaluation mode.

The control module can decrease the active interval such that the beam intensity and/or the exposure value is/are increased according to a predetermined relation, in particular by a fixed factor, per capture interval. The control module can implement a specific type of scaling, i.e., linear, square, exponential or logarithmic to set a relation for the active intervals of subsequent capture intervals. The scaling can affect the time interval during which a predetermined exposure value can be reached. Thus, the scaling can reduce the overall time interval spent in evaluation mode. Decreasing the duration of the evaluation mode can increase the performance of the system as a higher throughput of non-evaluation mode capture intervals can be achieved. Furthermore, a delay caused by the evaluation mode to determine whether the set parameters achieve a safe exposure value can be reduced. Preferably the time spent in evaluation mode is below a predetermined threshold such an efficiency impact on an imaging sequence can be reduced. The control module can reduce a set increase to not exceed a maximum safe exposure value.

The control module can predict a first exposure value for a subsequent capture interval based on an exposure value of a previous capture interval and to set the control interval for the subsequent capture interval based on the first exposure value. Furthermore, a set of previous capture intervals can be used to extrapolate the exposure values to estimate total interval lengths for the active interval and/or the inactive interval. Thus, based on a chosen gradient of the exposure value for a set of capture intervals, the control module can determine when a predetermined exposure value can be reached. Herein, a time interval and/or number of capture intervals can be estimated. This can yield an indication as to when the evaluation mode may end.

The control module can predict a second exposure value for a further capture interval following the subsequent capture interval based on the exposure value of the previous capture interval, to set the control interval for the subsequent capture interval and/or to set a further control interval for the further capture interval, and/or determine if the second exposure value is smaller or equal to the maximum safe exposure value. This achieves the advantage that a prediction of the exposure value can be performed for at least two subsequent capture intervals increasing the computing efficiency of the control module. The prediction can be increased to a plurality of subsequent capture intervals, in particular based on a confidence value pertaining to the prediction. Predicting the exposure values in reference to a maximum safe exposure value can achieve the advantage that an actual exposure value captured in the subsequent frames which is still within a margin of error for the prediction may still be below the maximum safe exposure value.

The control module can be configured to predict an exposure value for a selected capture interval of a sequence of subsequent capture intervals based on the exposure value of a previous capture interval. The sequence of subsequent capture intervals can comprise an increasing sequence of inactive intervals, i.e., the expected exposure value increases incrementally for each capture interval. The selected capture interval can be any capture interval within the sequence. Thus, the number difference between the subsequent capture interval and the selected capture interval can represent the number of increases that is skipped, when the control interval of the subsequent capture interval is set to the control interval of the selected capture interval. Setting the control interval can comprise setting an equivalent ratio of inactive interval to active intervals, i.e., the pattern can be identical or the pattern can be different as long as the total exposure time within the capture interval remains constant. Thus, the PWM scheme can be changed when setting the control interval.

The control module can determine if the exposure value is smaller or equal to the maximum safe exposure value and/or to set the control interval of the subsequent capture interval based on the control interval of the selected capture interval. Preferably, the previous step is executed when the exposure value is determined to be safe, i.e., within safe exposure limits, respectively below a maximum exposure value. Setting the subsequent capture interval based on the control interval of the selected capture interval can be defined as setting subsequent capture interval to the control interval of the selected capture interval.

The selected capture interval can be at the second position or higher of the sequence of subsequent capture intervals. Thus, the selected capture interval is not the subsequent capture interval and represents at least the next but one element in the sequence, such that at least one increase, i.e., one capture interval is skipped.

The control module can set the control interval for the subsequent capture interval based on the further capture interval, in particular to replace the subsequent capture interval with the further capture interval, preferably when the second exposure value is smaller or equal to the maximum safe exposure value or falls below the maximum safe exposure value by a predetermined margin value. This achieves the advantage that the control module can be configured to skip a control interval, to decrease the time or number of capture intervals it would take to reach the predetermined exposure settings. For example, when exposure values determined for a first set of capture intervals indicate that the complete set of capture intervals of the evaluation mode will not exceed maximum safe parameters a predetermined number of capture intervals with lower exposure than the setting to be achieved can be skipped. Thus, the evaluation mode can be exited sooner. In other words, the number of capture intervals with beam intensity reduced by the BCD can be reduced to more efficiently evaluate whether the current settings are safe to expose the beam to the sensor without active intervals or without additional active intervals of the BCD.

The control interval of the capture interval can comprise a first PWM duty cycle and the control interval of the subsequent capture interval comprises a second PWM duty cycle. The second PWM duty cycle can be higher than the first PWM duty cycle, preferably higher than a preset PWM duty cycle increase. This achieves the advantage that the control module can skip steps in a predetermined sequence of capture intervals with assigned preset PWM duty cycle values. Thus, when higher duty cycle values are determined to be within predetermined exposure value limits, the duty cycle for a subsequent frame can be increased such that part of the predetermined sequence of duty cycles to be captured is skipped. For example, a sequence of capture intervals can be set to increase the duty cycle by a factor of 5. With an exposure at 2% duty cycle in conjunction with determining that a 50% duty cycle is determined to be within safe exposure limits, the control module can set the duty cycle for a subsequent capture interval to 50%.

The control module can predict an exposure value for each capture interval in a capture sequence comprising a series of subsequent capture intervals. Thereby, the control module can estimate when a maximum safe exposure value would be reached. This can also be achieved outside of the evaluation mode to detect gradual increases in exposure value and to enter evaluation mode based on a detected increase. Preferably, the control module can predict an exposure value continuously for a predetermined number of subsequent capture intervals. Thus, exceeding the maximum safe exposure value can be anticipated and the BCD can be activated prior to actually capturing a capture interval that would exceed a maximum safe exposure value. This can further achieve the advantage that a delay in activating the BCD can be mitigated such that a beam signal with an intensity above a beam intensity threshold would not reach the sensor.

A total activation time corresponding to a summed duration of active intervals per capture interval can decrease for consecutive capture intervals within the capture sequence. With a decreasing activation interval, the beam intensity at the sensor can increase. The time interval the BCD is active decreases and the exposure time per capture interval increases.

The control module can set a first total activation time for a first capture interval of the capture sequence to a second total activation time of a second capture interval of the capture sequence. Thus, skipping ahead in the sequence of set exposure times can also be implemented while using PWM to modulate active intervals and inactive intervals. The control module can decrease the total activation time while maintaining a scaled form of the implemented PWM pattern. For example, the interval frequency of active intervals can remain constant while the interval length of each active interval, respectively inactive interval within the control interval is adjusted.

The second total activation time can be smaller than the first total activation time so that a first exposure value corresponding to the first total activation time is lower than a second exposure value corresponding to the second total activation time. Thus, the exposure value can increase within a sequence. The control module can achieve a control of the beam intensity at the sensor by testing a partial beam signal, i.e., a signal that is blocked by the BCD for a specific active interval during the capture interval. Thus, a change in exposure value can trigger the evaluation mode such that an exposure value change is initially not captured for a full capture interval, respectively a full control interval of the current settings. The control interval can be adjusted to comprise a maximum active interval to limit exposure of the beam signal to the sensor when the beam intensity changes. The total activation time can be summed over a set of active intervals of a PWM sequence.

The absolute difference between the first total activation time and the second total activation time can be smaller than an absolute difference between the total activation times of at least one pair of subsequent capture intervals of the capture sequence. A gradient of total activation time over a set of capture intervals can increase linearly, i.e., the difference can be constant, or non-linearly, i.e., the difference can decrease for a set of subsequent capture intervals. Alternatively, the total activation time can increase, in particular to counter an increase in beam intensity. A gradient of total activation time over a set of capture intervals can be adjusted based on exposure values of past capture intervals and/or based on predicted exposure values for subsequent capture intervals.

The absolute difference between the first total activation time and the second total activation time can be smaller than an absolute difference between the total activation times of two selected capture intervals of the capture sequence. Thus, the difference in activation time can be determined based on a predetermined set of capture intervals. The capture intervals do not need to be adjacent within a series of capture intervals. A total activation time can span multiple capture intervals.

The control module can decrease the total activation time of a capture interval by an amount equal to the combined reduction of the total activation time of at least two subsequent capture intervals of the capture sequence, in particular when the reduction yields a predicted exposure value below the maximum safe exposure value. The total activation time can be independent of the number of active intervals and/or the number of inactive intervals within a capture interval and/or within a control interval.

The control module can adjust a predicted exposure value of a capture interval of the capture sequence based on a determined exposure value of a capture interval, in particular a previous capture interval of the capture sequence. This can achieve the advantage that a prediction of the exposure value for subsequent frames can be adjusted based on exposure values of past capture intervals. Thus, an accuracy of the predicted exposure value can increase. An adjustment frequency of the predicted exposure value can be based on a predicted exposure value gradient for a set of subsequent capture intervals. In particular, exposure values exceeding a gradient threshold can cause a more frequent adjustment of the exposure value prediction to increase precision.

The control module can adjust a decrease rate of total activation time per capture interval within the capture sequence. This can increase efficiency and/or increase protection of the sensor. In particular, when the beam signal comprises a beam intensity with a beam intensity variance below a variance threshold, i.e., the beam intensity does not vary significantly between capture intervals, the decrease rate can be increased to reach the pre-set exposure parameters within a shorter time span, e.g., within a reduced number of capture intervals. Alternatively, when the beam signal comprises a beam intensity with a beam intensity variance above a variance threshold, i.e., the beam intensity varies significantly between capture intervals, the decrease rate can be decreased to capture the beam signal over a plurality of frames without significant decrease of the total activation time, to allow for a more detailed assessment of the beam signal without the risk of damaging the sensor.

The control module can divide the capture signal into a set of section signals, wherein each section signal comprises a cohesive subset of the capture signal, and determine a section exposure value for each section signal. The section signal can be a spatial subsection of the capture signal, i.e., a cohesive set of adjacent pixels, preferably a square or at least rectangular section of the capture signal. Each section signal can be checked individually for overexposure. The grid size can be adjusted based on the beam signal. In particular, the size of the section signal can correlate to an expected size of overexposed regions and can be adjusted accordingly. Preferably, the size of the section signal is larger than an expected size of an overexposed region.

The control module can overlap the cohesive subsets of the capture signal defining the section signals along at least one dimension of the beam signal, preferably spatially overlapping the cohesive subsets by at least 25%, more preferably spatially overlapping the cohesive subsets by at least 50%. This can achieve the advantage that an overexposed region can be evaluated in its entirety, i.e., an exposure value can reflect the actual exposure of a cohesive region, e.g., a bright spot. By overlapping the regions, the probability to capture a bright spot in its entirety within one section signal can be increased. The probability that a bright spot is divided into a plurality of section signals and thus an exposure value threshold may not be exceeded, can be decreased. In other words, the chance that a local beam intensity maximum that could potentially damage the sensor or reduce the lifetime of the sensor is split over several regions therefore may not be detected, can be reduced.

The control module can activate the BCD and/or enter the evaluation mode, when a section exposure value for a signal section exceeds a maximum section exposure value. Thus, a local overexposure can trigger a protection measure to reduce the beam intensity at the sensor. The exposure value can be based on a section exposure value or a plurality of section exposure values. Each section exposure value can be weighted based on the relative position of the respective section signal within the capture signal. For example, a higher weight can be assigned to regions of expected high beam intensity and/or with a high probability to be exposed to a high beam intensity. In particular, regions that are predicted to capture at least part of beam signal capturing a diffraction pattern can be assigned a higher weight compared to regions having a low probability to capture part of the diffraction pattern.

The control module can filter the capture signal to generate a filtered capture signal. Filtering the capture signal can reduce the probability to generate false positives when determining whether the exposure value threshold has been exceeded or not. A spatial filter can be applied by the control module to spread beam intensity peaks over a plurality of detector sites, e.g., pixels, of the sensor to increase the sensitivity to overexposure and/or differentiate an actual overexposure from defects within the sensor, e.g., hot pixels etc.

The control module can apply the filter to each section signal, in particular to apply the filtering in parallel to all section signals, to generate filtered section signals. Each section signal can, for example, cover a square region of the capture signal, in particular having an edge length based on a multiple of two, e.g., a 64 by 64 pixel area. The filtered signal can be based on dark corrected difference frames, where a dark corrected difference frame can be a difference of two capture signals with no beam signal hitting the sensor. The section signal may be as small as 5 by 5 pixels. The control module can be configured to distinguish an overexposure from sensor defects, i.e., distinguishing sensor-offsets, radiation damage, defective pixels and/or defective pixel clusters. Applying a filter can further provide the advantage to detect spot like or stripe like high beam intensity regions. Alternatively and/or additionally the control module can be configured to detect beam intensity peaks, respectively exposure value peaks based on the capture signal. In particular, a peak detection method can be implemented and the exposure value can be based on the results of the peak detection method. By applying the filter, the shape of peaks may be altered to increase the probability of them being detected as beam intensity peaks and/or overexposed areas.

The control module can determine an exposure value based on a filtered section signal. This achieves the advantage that the application of the filter, in particular in conjunction with considering at least one section can increase the sensitivity of the control module to register an overexposure and preferably control the BCD accordingly to limit the beam intensity.

The control module can spatially filter the capture signal to decrease spatial brightness gradients, in particular to smoothen brightness values. This can achieve the advantage of differentiating a brightness peak caused by the beam signal from sensor defects and/or signal artifacts. A decrease in spatial brightness gradients can, for example, be achieved by spreading a high brightness peak over a plurality of pixels.

The control module can receive a target capture interval, wherein the target capture interval is free of any active intervals, and/or wherein the control module is further configured to determine a maximum allowable beam intensity value and/or a maximum exposure value in reference to the target capture interval. The allowable beam intensity can scale based on the capture interval. For example, the allowable beam intensity can be inversely proportional to the capture interval length. The exposure can be controlled either by the BCD or by the capture interval length. The beam signal can comprise a non-stationary beam intensity pattern such that motion blur can be controlled either by an interval length of inactive intervals and/or by an interval length of the capture interval. The control module can adjust a capture based on the target capture interval and/or can adjust the control interval based on the target capture interval. The target capture interval can be realized by adjusting the inactive interval and active interval such that the inactive interval and or a total sum of inactive intervals correspond to the target capture interval.

The control module can incrementally increase the inactive interval per capture interval and/or to incrementally decrease the active interval per capture interval of a capture sequence and/or determine an exposure value for at least one capture interval of the capture sequence or each capture interval of the capture sequence, and/or set a control interval comprising only an inactive interval, respectively free of an active interval, based on at least one exposure value of a capture interval of the capture sequence. Thus, the control module can determine whether further test capture intervals with increased beam intensity should be captured to determine the actual beam intensity in reference to allowable parameters of the system. Based on an exposure value the control module can determine whether a subsequent exposure without an activation of the BCD will result in an overexposure of the sensor or not. When the exposure is controlled by an active interval and not by the capture interval, the target can be to keep a predetermined part of the capture interval free of active intervals.

The control module can match a maximum safe exposure value to a maximum safe capture interval. In particular a local maximum of beam intensity can produce a local overexposure in the capture signal. The capture interval and/or the sum of inactive intervals can be limited to not exceed a threshold value such that the sensor may not be overexposed.

The control module can determine an optimal safe capture interval. An optimal safe capture interval can also be an optimal safe ratio of active intervals to inactive intervals within a specific capture interval. An optimal safe capture interval can be determined based on the captured beam intensity and/or based on a corresponding exposure value. An optimal safe capture interval can be defined by maximizing a dynamic range of the representation of the beam signal by the capture signal, maximizing a sensor lifetime and/or reducing the captured beam intensity according to predetermined requirements. For capturing a diffraction pattern the spatial distribution of beam intensity peaks may have a higher relevancy than the intensity distribution. Thus, the control module may prioritize capturing each peak while reducing brightness resolution, i.e., dynamic range, and in turn limit the captured beam intensity to increase sensor lifetime.

The control module can determine a minimum exposure value and set a control interval based on the minimum exposure value such that the beam signal is captured and registered within the capture signal above a noise floor of the sensor and/or that a potential increase in exposure value to the maximum safe exposure value is maximized. With a minimum exposure value, a headroom to capture an intensity increase can be maximized. The control module can determine a minimum exposure value within the evaluation mode or as a separate step or mode. The minimum exposure value can be linked to a minimum activation and deactivation timing of the BCD, i.e., to a minimal length of an inactive interval achievable by the BCD. The evaluation mode can start with a minimum exposure value and/or minimum active interval of the BCD.

The sensor can capture the beam signal with a capture rate above a minimum capture rate threshold, in particular to provide a flicker-free, continuously updated capture signal.

The capture rate can be decoupled from a beam exposure interval defined by the total activation time per capture interval and/or wherein the capture rate is independent of a sequence of active intervals and inactive intervals. The control of the BCD can also be asynchronous to the camera shutter, i.e., the BCD activation pattern may shift for a series of capture intervals. Alternatively, the active intervals and inactive intervals may form a pattern that enables a consistent exposure without synchronization of the BCD control interval and the capture interval. For example, the pattern of active intervals and inactive intervals may have a significantly higher base frequency at which intervals alternate than a capture frequency.

The control module can adjust the control interval such that the BCD is activated when a capture interval ends and/or a capture interval begins.

According to a second aspect the invention relates to a method for sensor protection in electron imaging applications comprising the step of providing a modified beam signal based on an incoming beam signal, by varying an intensity of the modified beam signal over a predetermined time interval.

The Method can comprise capturing a beam signal, in particular the modified beam signal and/or the incoming beam signal, with a predetermined spatial resolution and/or a variable temporal resolution and providing a capture signal based on the captured beam signal.

The Method can comprise stopping the incoming beam signal from propagating past a BCD, in particular a blanker, in the initial propagation direction of the incoming beam signal when the BCD is activated.

The Method can comprise providing a switchable physical barrier which is configured to at least partially intersect the initial propagation direction of the incoming beam signal.

The Method can comprise providing an electrostatic field such that the initial propagation direction of the incoming beam signal and a modified propagation direction of the modified beam signal are angled with respect to one another, by means of activating an electrostatic shutter.

The Method can comprise providing an electromagnetic filed, in particular a periodic electromagnetic field, such that the initial propagation direction of the incoming beam signal and a modified propagation direction of the modified beam signal are angled with respect to one another, by means of activating an electromagnetic shutter.

The Method can comprise adjusting, in particular lowering, an intensity of the incoming beam to provide a modified beam having a substantially equal intensity as the incoming beam or a lower intensity than the incoming beam.

The Method can comprise blocking at least part of a cross section of the incoming beam.

The Method can comprise transforming the cross section of the incoming beam when activated.

The Method can comprise reflecting and/or deflecting the incoming beam signal at least partially.

The Method can comprise focusing and/or defocusing the incoming beam signal, in particular by increasing and/or decreasing the cross section of the incoming beam at an imaging plane.

Method according to any of the preceding embodiments, comprising the steps of transmitting a first part of the incoming beam signal to the imaging plane and transmitting a second part of the incoming beam signal towards a second imaging plane, wherein a surface-normal of the imaging plane and a further surface-normal of the second imaging plane are angled with respect to one another.

The Method can comprise shaping the cross section of the incoming beam signal, in particular by partially blocking the incoming beam signal.

The Method can comprise modifying the beam intensity profile over a time interval.

The Method can comprise moving the BCD relative to the initial propagation direction of the incoming beam signal.

Method according to any of the preceding embodiments, comprising the steps of translating and/or to rotating the BCD into an active position enabling the BCD to provide the modified beam signal and/or translating and/or rotating the BCD into an inactive position disabling the BCD from providing the modified beam signal.

The Method can comprise receiving a control signal and activating the BCD based on the control signal.

The Method can comprise activating the BCD for the duration of an activation time interval.

The Method can comprise specifying the activation time interval by the control signal.

The Method can comprise adjusting an interaction of the BCD with the incoming beam signal based on a control parameter.

The Method can comprise modifying a beam property of the incoming beam signal based on the control parameter.

The Method can comprise preventing the incoming beam signal from further propagating in the initial propagation direction past the BCD based on the block signal.

The Method can comprise activating and/or deactivating the BCD based on a timing parameter.

The Method can comprise receiving an emergency block signal and preventing the incoming beam signal from further propagating in the initial propagation direction past the BCD based on the emergency block signal.

The Method can comprise providing the control signal to the BCD.

The Method can comprise generating an exposure value based on the capture signal and modifying the control signal, in particular the control interval, based on the exposure value.

Method can comprise the steps of increasing the active interval and/or decreasing the inactive interval when the exposure value exceeds an upper threshold value and/or decreasing the active interval and/or increasing the inactive interval when the exposure value falls below a lower threshold value.

The Method can comprise adjusting the control interval such that the control interval comprises active intervals during which the BCD is to be active and inactive intervals during which the BCD is to be inactive and modifying the ratio of active intervals to inactive intervals based on the exposure value.

The Method can comprise increasing each active interval when the exposure value exceeds an upper threshold value and/or decreasing each active interval when the exposure value falls below a lower threshold value.

The Method can comprise decreasing each inactive interval when the exposure value exceeds an upper threshold value and/or increasing each inactive interval when the exposure value falls below a lower threshold value.

The Method can comprise adjusting an interval duration of active intervals and a further interval duration of inactive intervals such that an interval frequency remains constant.

The Method can comprise providing the control signal continuously to the BCD or providing the control signal to the BCD when the control signal changes.

The Method can comprise controlling the interval frequency based on the exposure value to match the exposure value to a predetermined base exposure value.

The Method can comprise adjusting the control interval based on a capture frequency of the sensor.

The Method can comprise modifying the interval duration of the active intervals and/or the further interval duration of the inactive intervals at a frequency smaller than or equal to the capture frequency.

The Method can comprise entering a limit mode when the exposure value exceeds a predetermined limit threshold.

The Method can comprise applying a pulse width modulation (PWM) to the control interval to control an averaged beam intensity of the modified beam signal during the control interval.

The Method can comprise adjusting the PWM of the control interval, in particular controlling the averaged beam intensity to achieve a predetermined exposure value, particularly a maximum safe exposure value.

The Method can comprise applying a duty cycle limit control to the control interval to limit a beam intensity during a capture interval of the beam signal by the sensor.

The Method can comprise adjusting the duty cycle of the control interval, in particular controlling the beam intensity to achieve a predetermined exposure value, particularly a maximum safe exposure value.

The Method can comprise entering an evaluation mode when receiving a trigger signal.

The Method can comprise setting a control interval comprising a predetermined maximum active interval and/or comprising a minimum inactive interval.

Method according to any of the preceding embodiments, comprising the steps of incrementally increasing the inactive interval per capture interval and/or incrementally decreasing the active interval per capture interval, in particular for a subsequent series of capture intervals.

The Method can comprise applying PWM to the control interval to limit the exposure value and to incrementally increase the number of active intervals and/or the duration of active intervals per capture interval.

The Method can comprise determining an increase of the exposure value per capture interval with reference to a previous capture interval.

The Method can comprise exiting the evaluation mode when a difference of the current exposure value and the maximum safe exposure value is smaller than a projected increase of the exposure value in a subsequent capture interval.

The Method can comprise exiting the evaluation mode when a determined exposure value falls below the maximum safe exposure value and/or the control interval comprises a predetermined ratio of active intervals to inactive intervals, preferably the control interval comprises an inactive interval only.

The Method can comprise maintaining the control signal with a control interval comprising a pattern of active intervals and inactive intervals corresponding to the last exposure value determined in the evaluation mode.

The Method can comprise controlling the exposure value of a subsequent capture interval, preferably a plurality of subsequent capture intervals, to an exposure value determined in the evaluation mode, in particular determined last in the evaluation mode.

The Method can comprise adjusting the active interval pattern while maintaining the last exposure value determined in the evaluation mode.

The Method can comprise transforming a PWM active interval pattern to a continuous active interval per capture interval.

The Method can comprise setting an attenuation parameter to control the intensity of the modified beam signal.

The Method can comprise increasing the beam intensity per capture interval and determining the exposure value for each increase.

The Method can comprise decreasing the active interval such that the beam intensity and/or the exposure value is/are increased by a fixed amount per capture interval.

The Method can comprise decreasing the active interval such that the beam intensity and/or the exposure value is/are increased according to a predetermined relation, in particular by a fixed factor, per capture interval.

The Method can comprise predicting a first exposure value for a subsequent capture interval based on an exposure value of a previous capture interval and setting the control interval for the subsequent capture interval based on the first exposure value.

The Method can comprise predicting a second exposure value for a further capture interval following the subsequent capture interval based on the exposure value of the previous capture interval, setting the control interval for the subsequent capture interval and/or setting a further control interval for the further capture interval, and/or determining if the second exposure value is smaller or equal to the maximum safe exposure value.

The Method can comprise setting the control interval for the subsequent capture interval based on the further capture interval, in particular to replace the subsequent capture interval with the further capture interval, preferably when the second exposure value is smaller or equal to the maximum safe exposure value or falls below the maximum safe exposure value by a predetermined margin value.

The Method can comprise predicting an exposure value for each capture interval in a capture sequence comprising a series of subsequent capture intervals.

The Method can comprise decreasing a total activation time corresponding to a summed duration of active intervals per capture interval for consecutive capture intervals within the capture sequence.

The Method can comprise setting a first total activation time for a first capture interval of the capture sequence to a second total activation time of a second capture interval of the capture sequence.

The Method can comprise decreasing the total activation time of a capture interval by an amount equal to the combined reduction of the total activation time of at least two subsequent capture intervals of the capture sequence, in particular when the reduction yields a predicted exposure value below the maximum safe exposure value.

The Method can comprise adjusting a predicted exposure value of a capture interval of the capture sequence based on a determined exposure value of a capture interval, in particular a previous capture interval of the capture sequence.

The Method can comprise adjusting a decrease rate of total activation time per capture interval within the capture sequence.

The Method can comprise dividing the capture signal into a set of section signals, wherein each section signal comprises a cohesive subset of the capture signal, and determining a section exposure value for each section signal.

The Method can comprise overlapping the cohesive subsets of the capture signal defining the section signals along at least one dimension of the beam signal, preferably spatially overlapping the cohesive subsets by at least 25%, more preferably spatially overlapping the cohesive subsets by at least 50%.

The Method can comprise activating the BCD and/or entering the evaluation mode, when a section exposure value for a signal section exceeds a maximum section exposure value.

The Method can comprise filtering the capture signal to generate a filtered capture signal.

The Method can comprise applying the filter to each section signal, in particular applying the filtering in parallel to all section signals, to generate filtered section signals.

The Method can comprise determining an exposure value based on a filtered section signal.

The Method can comprise spatially filtering the capture signal to decrease spatial brightness gradients, in particular to smoothen brightness values.

The Method can comprise receiving a target capture interval, wherein the target capture interval is free of any active intervals, and/or determining a maximum allowable beam intensity value and/or a maximum exposure value in reference to the target capture interval.

The method can comprise the steps of incrementally increasing the inactive interval per capture interval and/or incrementally decreasing the active interval per capture interval of a capture sequence and/or determining an exposure value for at least one capture interval of the capture sequence or each capture interval of the capture sequence, and/or setting a control interval comprising only an inactive interval, respectively free of an active interval, based on at least one exposure value of a capture interval of the capture sequence.

The Method can comprise matching a maximum safe exposure value to a maximum safe capture interval.

The Method can comprise determining an optimal safe capture interval.

The Method can comprise determining a minimum exposure value and setting a control interval based on the minimum exposure value such that the beam signal is captured and registered within the capture signal above a noise floor of the sensor and/or that a potential increase in exposure value to the maximum safe exposure value is maximized.

The Method can comprise capturing the beam signal with a capture rate above a minimum capture rate threshold, in particular to provide a flicker-free, continuously updated capture signal.

The Method can comprise adjusting the control interval such that the BCD is activated when a capture interval ends and/or a capture interval begins.

The present invention is further defined by the following numbered embodiments.

Below, system embodiments will be discussed. These embodiments are abbreviated by the letter "S" followed by a number. Whenever reference is herein made to "system embodiments", these embodiments are meant.

S1. System for sensor protection in electron imaging applications comprising a beam control device (BCD) configured to provide a beam signal based on an incoming beam signal, wherein the beam signal comprises an altered beam intensity.

S2. System according to the preceding embodiment, wherein the BCD is configured to vary an intensity of the beam signal over a predetermined time interval.

S3. System according to any of the preceding embodiments, comprising a sensor configured to capture the beam signal, in particular the modified beam signal and/or the incoming beam signal, and to provide a capture signal based on the beam signal.

S4. System according to any of the preceding embodiments with features of S3, wherein the sensor is configured to provide a spatially and/or temporally resolved representation of the beam signal as part of the capture signal.

S5. System according to any of the preceding embodiments, wherein the BCD comprises a blanker configured to stop the incoming beam signal from propagating past the blanker in the initial propagation direction of the incoming beam signal when activated.

S6. System according to any of the preceding embodiments, wherein the BCD comprises a mechanical shutter, configured to provide a switchable physical barrier when activated which is configured to at least partially intersect the initial propagation direction of the incoming beam signal.

S7. System according to any of the preceding embodiments, wherein the BCD comprises an electrostatic shutter, configured to provide an electrostatic field when activated such that the initial propagation direction of the incoming beam signal and a modified propagation direction of the modified beam signal are angled with respect to one another, in particular when the electrostatic shutter is active.

S8. System according to any of the preceding embodiments, wherein the BCD comprises an electromagnetic (electrodynamic) shutter, configured to provide an electromagnetic filed, in particular a periodic electromagnetic field, when activated such that the initial propagation direction of the incoming beam signal and a modified propagation direction of the modified beam signal are angled with respect to one another, in particular when the electromagnetic shutter is active.

S9. System according to any of the preceding embodiments, wherein the BCD comprises an attenuator, configured to lower an intensity of the incoming beam when activated to provide a modified beam having a substantially equal intensity as the incoming beam signal or a lower intensity than the incoming beam signal.

S10. System according to any of the preceding embodiments, wherein the BCD comprises an aperture, configured to block at least part of a cross section of the incoming beam signal when activated.

S11. System according to any of the preceding embodiments, wherein the BCD comprises a lens, configured to transform the cross section of the incoming beam when activated.

S12. System according to any of the preceding embodiments, wherein the BCD comprises a mirror configured to at least partially reflect and/or deflect the incoming beam signal when activated.

S13. System according to any of the preceding embodiments, wherein the BCD comprises a focus element configured to focus and/or defocus the incoming beam signal when activated, in particular by increasing and/or decreasing the cross section of the incoming beam at an imaging plane.

S14. System according to any of the preceding embodiments, wherein the BCD comprises a beam splitter configured to transmit a first part of the incoming beam signal to the imaging plane and to transmit a second part of the incoming beam signal towards a second imaging plane when activated, wherein a surface-normal of the imaging plane and a further surface-normal of the second imaging plane are angled with respect to one another.

S15. System according to any of the preceding embodiments, wherein the BCD comprises a slit configured to shape the cross section of the incoming beam signal when activated, in particular by partially blocking the incoming beam signal.

S16. System according to any of the preceding embodiments, wherein the BCD comprises a beam chopper configured to modify the beam intensity profile over a time interval when activated.

S17. System according to any of the preceding embodiments, comprising a motion component, configured to move the BCD relative to the initial propagation direction of the incoming beam signal.

S18. System according to any of the preceding embodiments, with features of S17, wherein the motion component is configured to translate and/or to rotate the BCD into an active position enabling the BCD to provide the modified beam signal and/or to translate and/or rotate the BCD into an inactive position disabling the BCD from providing the modified beam signal.

S19. System according to any of the preceding embodiments, wherein the BCD is configured to receive a control signal and to activate and/or to deactivate based on the control signal.

S20. System according to any of the preceding embodiments, with features of S19, wherein the BCD is configured to activate for the duration of an active interval and/or to deactivate for the duration of an inactive interval.

S21. System according to any of the preceding embodiments, with features of S20, wherein the control signal comprises a control interval having an active interval and/or an inactive interval.

S22. System according to any of the preceding embodiments, with features of S20, wherein the active interval and the inactive interval form a periodic signal.

S23. System according to any of the preceding embodiments, wherein the BCD is configured to receive a control parameter and to adjust an interaction with the incoming beam signal based on the control parameter.

S24. System according to any of the preceding embodiments, with features of S19, wherein the BCD is configured to modify a beam property of the incoming beam signal based on the control parameter.

S25. System according to any of the preceding embodiments, wherein the BCD is configured to receive a block signal and to prevent the incoming beam signal from further propagating in the initial propagation direction past the BCD based on the block signal.

S26. System according to any of the preceding embodiments, with features of S19, wherein the control signal comprises a timing parameter, and wherein the BCD is configured to activate and/or to deactivate based on the timing parameter.

S27. System according to any of the preceding embodiments, comprising a secondary BCD configured to receive an emergency block signal and to prevent the incoming beam signal from further propagating in the initial propagation direction past the secondary BCD based on the emergency block signal.

S28. System according to any of the preceding embodiments, with features of S27, wherein the secondary BCD is a BCD according to any one of the embodiments S5 to S12.

S29. System according to any of the preceding embodiments, with features of S27, wherein the secondary BCD is placed upstream or downstream of the BCD in reference to the direction of the incoming beam signal.

S30. System according to any of the preceding embodiments comprising a control module configured to provide the control signal and/or the block signal to the BCD and/or to provide the emergency block signal to the secondary BCD.

S31. System according to any of the preceding embodiments with features of S3 and S30, wherein the control module is configured to generate an exposure value based on the capture signal and to modify the control signal, in particular the control interval, based on the exposure value.

S32. System according to any of the preceding embodiments with features of S31, wherein the control module is configured to decrease the active interval while the exposure value does not exceed an upper threshold value, in particular a maximum safe exposure value.

S33. System according to any of the preceding embodiments with features of S31, wherein the control module is configured to increase the active interval and/or to decrease the inactive interval when the exposure value exceeds the upper threshold value, and/or to decrease the active interval and/or to increase the inactive interval when the exposure value falls below a lower threshold value, in particular a minimum detection exposure value.

S34. System according to any of the preceding embodiments with features of S21 and S31, wherein the control module is configured to adjust the control interval such that the control interval comprises active intervals during which the BCD is to be active and inactive intervals during which the BCD is to be inactive and wherein the control module is configured to modify the ratio of active intervals to inactive intervals based on the exposure value.

S35. System according to any of the preceding embodiments with features of S34, wherein the control module is configured to increase each active interval when the exposure value exceeds an upper threshold value and/or to decrease each active interval when the exposure value falls below a lower threshold value.

S36. System according to any of the preceding embodiments with features of S34, wherein the control module is configured to decrease each inactive interval when the exposure value exceeds an upper threshold value and/or to increase each inactive interval when the exposure value falls below a lower threshold value.

S37. System according to any of the preceding embodiments with features of S34, wherein the control module is configured to adjust an interval duration of active intervals and a further interval duration of inactive intervals such that an interval frequency remains constant.

S38. System according to any of the preceding embodiments with features of S30, wherein the control module is configured to provide the control signal continuously to the BCD or to provide the control signal to the BCD when the control signal changes.

S39. System according to any of the preceding embodiments with features of S34, wherein the control module is configured to control the interval frequency based on the exposure value to match the exposure value to a predetermined base exposure value.

S40. System according to any of the preceding embodiments with features of S3 and S30, wherein the control module is configured to adjust the control interval based on a capture frequency of the sensor.

S41. System according to any of the preceding embodiments with features of S40, wherein the control module is configured to modify the interval duration of the active intervals and/or the further interval duration of the inactive intervals at a frequency smaller than or equal to the capture frequency.

S42. System according to any of the preceding embodiments with features of S31, wherein the control module is configured to enter a limit mode when the exposure value exceeds a predetermined limit threshold.

S43. System according to any of the preceding embodiments with features of S42, wherein the control module is configured to apply a pulse width modulation (PWM) to the control interval to control an average beam intensity of the modified beam signal during the control interval.

S44. System according to any of the preceding embodiments with features of S43, wherein the control module is configured to adjust the PWM of the control interval, in particular to control the average beam intensity to achieve a predetermined exposure value, particularly a maximum safe exposure value.

S45. System according to any of the preceding embodiments with features of S20 and S42, wherein the control module is configured to apply a duty cycle limit control to the control interval to limit a beam intensity during a capture interval of the beam signal by the sensor.

S46. System according to any of the preceding embodiments with features of S45, wherein the control module is configured to adjust the duty cycle of the control interval, in particular to control the beam intensity to achieve a predetermined exposure value, particularly a maximum safe exposure value.

S47. System according to any of the preceding embodiments with features of S31, wherein the control module is configured to enter an evaluation mode when the control module receives a trigger signal.

S48. System according to any of the preceding embodiments with features of S47, wherein the control module is configured to set a control interval comprising a predetermined maximum active interval and/or comprising a minimum inactive interval.

S49. System according to any of the preceding embodiments with features of S47, wherein the control module is configured to incrementally increase the inactive interval per capture interval and/or to incrementally decrease the active interval per capture interval, in particular for a subsequent series of capture intervals.

S50. System according to any of the preceding embodiments with features of S47, wherein the control module is configured to apply PWM to the control interval to limit the exposure value and to incrementally increase the number of active intervals and/or the duration of active intervals per capture interval.

S51. System according to any of the preceding embodiments with features of S47, wherein the control module is configured to determine an increase of the exposure value per capture interval with reference to a previous capture interval.

S52. System according to any of the preceding embodiments with features of S51, wherein the control module is configured to exit the evaluation mode when a difference of the current exposure value and the maximum safe exposure value is smaller than a projected increase of the exposure value in a subsequent capture interval.

S53. System according to any of the preceding embodiments with features of S51, wherein the control module is configured to exit the evaluation mode when a determined exposure value falls below the maximum safe exposure value and/or the control interval comprises a predetermined ratio of active intervals to inactive intervals, preferably the control interval comprises an inactive interval only.

S54. System according to any of the preceding embodiments with features of S52, wherein the control module is configured to maintain the control signal with a control interval comprising a pattern of active intervals and inactive intervals corresponding to the last exposure value determined in the evaluation mode.

S55. System according to any of the preceding embodiments with features of S52, wherein the control module is configured to control the exposure value of a subsequent capture interval, preferably a plurality of subsequent capture intervals, to an exposure value determined in the evaluation mode, in particular determined last in the evaluation mode.

S56. System according to any of the preceding embodiments with features of S55, wherein the control module is configured to adjust the active interval pattern while maintaining the last exposure value determined in the evaluation mode.

S57. System according to any of the preceding embodiments with features of S56, wherein the control module is configured to transform a PWM active interval pattern to a continuous active interval per capture interval.

S58. System according to any of the preceding embodiments with features of at least one of S9 to S13 and S30, wherein the control module is configured to set an attenuation parameter to control the intensity of the modified beam signal.

S59. System according to any of the preceding embodiments with features of S47 and S58, wherein the control module is configured to increase the beam intensity per capture interval and determine the exposure value for each increase.

S60. System according to any of the preceding embodiments with features of S47, wherein the control module is configured to decrease the active interval such that the beam intensity and/or the exposure value is/are increased by a fixed amount per capture interval.

S61. System according to any of the preceding embodiments with features of S47, wherein the control module is configured to decrease the active interval such that the beam intensity and/or the exposure value is/are increased according to a predetermined relation, in particular by a fixed factor, per capture interval.

S62. System according to any of the preceding embodiments with features of S47, wherein the control module is configured to predict a first exposure value for a subsequent capture interval based on an exposure value of a previous capture interval and to set the control interval for the subsequent capture interval based on the first exposure value.

S63. System according to any of the preceding embodiments with features of S62, wherein the control module is configured to predict a second exposure value for a further capture interval following the subsequent capture interval based on the exposure value of the previous capture interval, to set the control interval for the subsequent capture interval and/or to set a further control interval for the further capture interval, and/or to determine if the second exposure value is smaller or equal to the maximum safe exposure value.

S64. System according to any of the preceding embodiments, wherein the control module is configured to predict an exposure value for a selected capture interval of a sequence of subsequent capture intervals based on the exposure value of a previous capture interval, determine if the exposure value is smaller or equal to the maximum safe exposure value, and/or to set the control interval of the subsequent capture interval based on the control interval of the selected capture interval and/or wherein the selected capture interval is at the second position or higher of the sequence of subsequent capture intervals.

S65. System according to any of the preceding embodiments with features of S63, wherein the control module is configured to set the control interval for the subsequent capture interval based on the further capture interval, in particular to replace the subsequent capture interval with the further capture interval, preferably when the second exposure value is smaller or equal to the maximum safe exposure value or falls below the maximum safe exposure value by a predetermined margin value.

S66. System according to any of the preceding embodiments with features of S65, wherein the control interval of the capture interval comprises a first PWM duty cycle and the control interval of the subsequent capture interval comprises a second PWM duty cycle, and wherein the second PWM duty cycle is higher than the first PWM duty cycle, preferably higher than a preset PWM duty cycle increase.

S67. System according to any of the preceding embodiments with features of S47, wherein the control module is configured to predict an exposure value for each capture interval in a capture sequence comprising a series of subsequent capture intervals.

S68. System according to any of the preceding embodiments with features of S67, wherein a total activation time corresponding to a summed duration of active intervals per capture interval decreases for consecutive capture intervals within the capture sequence.

S69. System according to any of the preceding embodiments with features of S67, wherein the control module is configured to set a first total activation time for a first capture interval of the capture sequence to a second total activation time of a second capture interval of the capture sequence.

S70. System according to any of the preceding embodiments with features of S69, wherein the second total activation time is smaller than the first total activation time so that a first exposure value corresponding to the first total activation time is lower than a second exposure value corresponding to the second total activation time.

S71. System according to any of the preceding embodiments with features of S70, wherein the absolute difference between the first total activation time and the second total activation time is smaller than an absolute difference between the total activation times of at least one pair of subsequent capture intervals of the capture sequence.

S72. System according to any of the preceding embodiments with features of S70, wherein the absolute difference between the first total activation time and the second total activation time is smaller than an absolute difference between the total activation times of two selected capture intervals of the capture sequence.

S73. System according to any of the preceding embodiments with features of S67, wherein the control module is configured to decrease the total activation time of a capture interval by an amount equal to the combined reduction of the total activation time of at least two subsequent capture intervals of the capture sequence, in particular when the reduction yields a predicted exposure value below the maximum safe exposure value.

S74. System according to any of the preceding embodiments, with features of S47, wherein the control module is configured to adjust a predicted exposure value of a capture interval of the capture sequence based on a determined exposure value of a capture interval, in particular a previous capture interval of the capture sequence.

S75. System according to any of the preceding embodiments, with features of S47, wherein the control module is configured to adjust a decrease rate of total activation time per capture interval within the capture sequence.

S76. System according to any of the preceding embodiments, with features of S3 and S30, wherein the control module is configured to divide the capture signal into a set of section signals, wherein each section signal comprises a cohesive subset of the capture signal, and to determine a section exposure value for each section signal.

S77. System according to any of the preceding embodiments, with features of S76, wherein the control module is configured to overlap the cohesive subsets of the capture signal defining the section signals along at least one dimension of the beam signal, preferably spatially overlapping the cohesive subsets by at least 25%, more preferably spatially overlapping the cohesive subsets by at least 50%.

S78. System according to any of the preceding embodiments, with features of S77, wherein the control module is configured to activate the BCD and/or to enter the evaluation mode, when a section exposure value for a signal section exceeds a maximum section exposure value.

S79. System according to any of the preceding embodiments, with features of S3 and S30, wherein the control module is configured to filter the capture signal to generate a filtered capture signal.

S80. System according to any of the preceding embodiments, with features of S76 and S79, wherein the control module is configured to apply the filter to each section signal, in particular to apply the filtering in parallel to all section signals, to generate filtered section signals.

S81. System according to any of the preceding embodiments, with features of S80, wherein the control module is configured to determine an exposure value based on a filtered section signal.

S82. System according to any of the preceding embodiments, with features of S79, wherein the control module is configured to spatially filter the capture signal to decrease spatial brightness gradients, in particular to smoothen brightness values.

S83. System according to any of the preceding embodiments, with features of S30, wherein the control module is configured to receive a target capture interval, wherein the target capture interval is free of any active intervals, and/or wherein the control module is further configured to determine a maximum allowable beam intensity value and/or a maximum exposure value in reference to the target capture interval.

S84. System according to any of the preceding embodiments, with features of S83, wherein the control module is configured to incrementally increase the inactive interval per capture interval and/or to incrementally decrease the active interval per capture interval of a capture sequence and/or to determine an exposure value for at least one capture interval of the capture sequence or each capture interval of the capture sequence, and/or to set a control interval comprising only an inactive interval, respectively free of an active interval, based on at least one exposure value of a capture interval of the capture sequence.

S85. System according to any of the preceding embodiments, with features of S30, wherein the control module is configured to match a maximum safe exposure value to a maximum safe capture interval.

S86. System according to any of the preceding embodiments, with features of S30, wherein the control module is configured to determine an optimal safe capture interval.

S87. System according to any of the preceding embodiments, with features of S30, wherein the control module is configured to determine a minimum exposure value and set a control interval based on the minimum exposure value such that the beam signal is captured and registered within the capture signal above a noise floor of the sensor and/or that a potential increase in exposure value to the maximum safe exposure value is maximized.

S88. System according to any of the preceding embodiments, wherein the sensor is configured to capture the beam signal with a capture rate above a minimum capture rate threshold, in particular to provide a flicker-free, continuously updated capture signal.

S89. System according to any of the preceding embodiments, wherein the capture rate is decoupled from a beam exposure interval defined by the total activation time per capture interval and/or wherein the capture rate is independent of a sequence of active intervals and inactive intervals.

S90. System according to any of the preceding embodiments, wherein the control module is configured to adjust the control interval such that the BCD is activated when a capture interval ends and/or a capture interval begins.

Below, method embodiments will be discussed. These embodiments are abbreviated by the letter "M" followed by a number. Whenever reference is herein made to "method embodiments", these embodiments are meant.

M1. Method for sensor protection in electron imaging applications comprising the step of
providing a modified beam signal based on an incoming beam signal, by varying an intensity of the modified beam signal over a predetermined time interval.

M2. Method according to the preceding embodiment, comprising the steps of
capturing a beam signal, in particular the modified beam signal and/or the incoming beam signal, with a predetermined spatial resolution and/or a variable temporal resolution; and
providing a capture signal based on the captured beam signal.

M3. Method according to any of the preceding embodiments, comprising the step of stopping the incoming beam signal from propagating past a BCD, in particular a blanker, in the initial propagation direction of the incoming beam signal when the BCD is activated.

M4. Method according to any of the preceding embodiments, comprising the step of providing a switchable physical barrier which is configured to at least partially intersect the initial propagation direction of the incoming beam signal.

M5. Method according to any of the preceding embodiments, comprising the step of providing an electrostatic field such that the initial propagation direction of the incoming beam signal and a modified propagation direction of the modified beam signal are angled with respect to one another, by means of activating an electrostatic shutter.

M6. Method according to any of the preceding embodiments, comprising the step of providing an electromagnetic filed, in particular a periodic electromagnetic field, such that the initial propagation direction of the incoming beam signal and a modified propagation direction of the modified beam signal are angled with respect to one another, by means of activating an electromagnetic shutter.

M7. Method according to any of the preceding embodiments, comprising the step of adjusting, in particular lowering, an intensity of the incoming beam to provide a modified beam having a substantially equal intensity as the incoming beam or a lower intensity than the incoming beam.

M8. Method according to any of the preceding embodiments, comprising the step of blocking at least part of a cross section of the incoming beam.

M9. Method according to any of the preceding embodiments, comprising the step of transforming the cross section of the incoming beam when activated.

M10. Method according to any of the preceding embodiments, comprising the step of reflecting and/or deflecting the incoming beam signal at least partially.

M11. Method according to any of the preceding embodiments, comprising the step of focusing and/or defocusing the incoming beam signal, in particular by increasing and/or decreasing the cross section of the incoming beam at an imaging plane.

M12. Method according to any of the preceding embodiments, comprising the steps of transmitting a first part of the incoming beam signal to the imaging plane and transmitting a second part of the incoming beam signal towards a second imaging plane, wherein a surface-normal of the imaging plane and a further surface-normal of the second imaging plane are angled with respect to one another.

M13. Method according to any of the preceding embodiments, comprising the step of shaping the cross section of the incoming beam signal, in particular by partially blocking the incoming beam signal.

M14. Method according to any of the preceding embodiments, comprising the step of modifying the beam intensity profile over a time interval.

M15. Method according to any of the preceding embodiments, comprising the step of moving the BCD relative to the initial propagation direction of the incoming beam signal.

M16. Method according to any of the preceding embodiments, comprising the steps of translating and/or to rotating the BCD into an active position enabling the BCD to provide the modified beam signal and/or translating and/or rotating the BCD into an inactive position disabling the BCD from providing the modified beam signal.

M17. Method according to any of the preceding embodiments, comprising the step of receiving a control signal and activating the BCD based on the control signal.

M18. Method according to any of the preceding embodiments, comprising the step of activating the BCD for the duration of an activation time interval.

M19. Method according to any of the preceding embodiments, comprising the step of specifying the activation time interval by the control signal.

M20. Method according to any of the preceding embodiments, comprising the step of adjusting an interaction of the BCD with the incoming beam signal based on a control parameter.

M21. Method according to any of the preceding embodiments, comprising the step of modifying a beam property of the incoming beam signal based on the control parameter.

M22. Method according to any of the preceding embodiments, comprising the step of preventing the incoming beam signal from further propagating in the initial propagation direction past the BCD based on the block signal.

M23. Method according to any of the preceding embodiments, comprising the step of activating and/or deactivating the BCD based on a timing parameter.

M24. Method according to any of the preceding embodiments, comprising the step of receiving an emergency block signal and preventing the incoming beam signal from further propagating in the initial propagation direction past the BCD based on the emergency block signal.

M25. Method according to any of the preceding embodiments, comprising the step of providing the control signal to the BCD.

M26. Method according to any of the preceding embodiments, comprising the step of generating an exposure value based on the capture signal and modifying the control signal, in particular the control interval, based on the exposure value.

M27. Method according to any of the preceding embodiments, comprising the steps of increasing the active interval and/or to decreasing the inactive interval when the exposure value exceeds an upper threshold value and/or decreasing the active interval and/or increasing the inactive interval when the exposure value falls below a lower threshold value.

M28. Method according to any of the preceding embodiments, comprising the step of adjusting the control interval such that the control interval comprises active intervals during which the BCD is to be active and inactive intervals during which the BCD is to be inactive and modifying the ratio of active intervals to inactive intervals based on the exposure value.

M29. Method according to any of the preceding embodiments, comprising the step of increasing each active interval when the exposure value exceeds an upper threshold value and/or decreasing each active interval when the exposure value falls below a lower threshold value.

M30. Method according to any of the preceding embodiments, comprising the step of decreasing each inactive interval when the exposure value exceeds an upper threshold value and/or increasing each inactive interval when the exposure value falls below a lower threshold value.

M31. Method according to any of the preceding embodiments, comprising the step of adjusting an interval duration of active intervals and a further interval duration of inactive intervals such that an interval frequency remains constant.

M32. Method according to any of the preceding embodiments, comprising the step of providing the control signal continuously to the BCD or providing the control signal to the BCD when the control signal changes.

M33. Method according to any of the preceding embodiments, comprising the step of controlling the interval frequency based on the exposure value to match the exposure value to a predetermined base exposure value.

M34. Method according to any of the preceding embodiments, comprising the step of adjusting the control interval based on a capture frequency of the sensor.

M35. Method according to any of the preceding embodiments, comprising the step of modifying the interval duration of the active intervals and/or the further interval duration of the inactive intervals at a frequency smaller than or equal to the capture frequency.

M36. Method according to any of the preceding embodiments, comprising the step of entering a limit mode when the exposure value exceeds a predetermined limit threshold.

M37. Method according to any of the preceding embodiments, comprising the step of applying a pulse width modulation (PWM) to the control interval to control an averaged beam intensity of the modified beam signal during the control interval.

M38. Method according to any of the preceding embodiments, comprising the step of adjusting the PWM of the control interval, in particular controlling the averaged beam intensity to achieve a predetermined exposure value, particularly a maximum safe exposure value.

M39. Method according to any of the preceding embodiments, comprising the step of applying a duty cycle limit control to the control interval to limit a beam intensity during a capture interval of the beam signal by the sensor.

M40. Method according to any of the preceding embodiments, comprising the step of adjusting the duty cycle of the control interval, in particular controlling the beam intensity to achieve a predetermined exposure value, particularly a maximum safe exposure value.

M41. Method according to any of the preceding embodiments, comprising the step of entering an evaluation mode when receiving a trigger signal.

M42. Method according to any of the preceding embodiments, comprising the step of setting a control interval comprising a predetermined maximum active interval and/or comprising a minimum inactive interval.

M43. Method according to any of the preceding embodiments, comprising the steps of incrementally increasing the inactive interval per capture interval and/or incrementally decreasing the active interval per capture interval, in particular for a subsequent series of capture intervals.

M44. Method according to any of the preceding embodiments, comprising the step of applying PWM to the control interval to limit the exposure value and to incrementally increase the number of active intervals and/or the duration of active intervals per capture interval.

M45. Method according to any of the preceding embodiments, comprising the step of determining an increase of the exposure value per capture interval with reference to a previous capture interval.

M46. Method according to any of the preceding embodiments, comprising the step of exiting the evaluation mode when a difference of the current exposure value and the maximum safe exposure value is smaller than a projected increase of the exposure value in a subsequent capture interval.

M47. Method according to any of the preceding embodiments, comprising the step of exiting the evaluation mode when a determined exposure value falls below the maximum safe exposure value and/or the control interval comprises a predetermined ratio of active intervals to inactive intervals, preferably the control interval comprises an inactive interval only.

M48. Method according to any of the preceding embodiments, comprising the step of maintaining the control signal with a control interval comprising a pattern of active intervals and inactive intervals corresponding to the last exposure value determined in the evaluation mode.

M49. Method according to any of the preceding embodiments, comprising the step of controlling the exposure value of a subsequent capture interval, preferably a plurality of subsequent capture intervals, to an exposure value determined in the evaluation mode, in particular determined last in the evaluation mode.

M50. Method according to any of the preceding embodiments, comprising the step of adjusting the active interval pattern while maintaining the last exposure value determined in the evaluation mode.

M51. Method according to any of the preceding embodiments, comprising the step of transforming a PWM active interval pattern to a continuous active interval per capture interval.

M52. Method according to any of the preceding embodiments, comprising the step of setting an attenuation parameter to control the intensity of the modified beam signal.

M53. Method according to any of the preceding embodiments, comprising the step of increasing the beam intensity per capture interval and determining the exposure value for each increase.

M54. Method according to any of the preceding embodiments, comprising the step of decreasing the active interval such that the beam intensity and/or the exposure value is/are increased by a fixed amount per capture interval.

M55. Method according to any of the preceding embodiments, comprising the step of decreasing the active interval such that the beam intensity and/or the exposure value is/are increased according to a predetermined relation, in particular by a fixed factor, per capture interval.

M56. Method according to any of the preceding embodiments, comprising the step of predicting a first exposure value for a subsequent capture interval based on an exposure value of a previous capture interval and setting the control interval for the subsequent capture interval based on the first exposure value.

M57. Method according to any of the preceding embodiments, comprising the step of predicting a second exposure value for a further capture interval following the subsequent capture interval based on the exposure value of the previous capture interval, setting the control interval for the subsequent capture interval and/or setting a further control interval for the further capture interval, and/or determining if the second exposure value is smaller or equal to the maximum safe exposure value.

M58. Method according to any of the preceding embodiments, comprising the step of setting the control interval for the subsequent capture interval based on the further capture interval, in particular to replace the subsequent capture interval with the further capture interval, preferably when the second exposure value is smaller or equal to the maximum safe exposure value or falls below the maximum safe exposure value by a predetermined margin value.

M59. Method according to any of the preceding embodiments, comprising the step of predicting an exposure value for each capture interval in a capture sequence comprising a series of subsequent capture intervals.

M60. Method according to any of the preceding embodiments, comprising the step of decreasing a total activation time corresponding to a summed duration of active intervals per capture interval for consecutive capture intervals within the capture sequence.

M61. Method according to any of the preceding embodiments, comprising the step of setting a first total activation time for a first capture interval of the capture sequence to a second total activation time of a second capture interval of the capture sequence.

M62. Method according to any of the preceding embodiments, comprising the step of decreasing the total activation time of a capture interval by an amount equal to the combined reduction of the total activation time of at least two subsequent capture intervals of the capture sequence, in particular when the reduction yields a predicted exposure value below the maximum safe exposure value.

M63. Method according to any of the preceding embodiments, comprising the step of adjusting a predicted exposure value of a capture interval of the capture sequence based on a determined exposure value of a capture interval, in particular a previous capture interval of the capture sequence.

M64. Method according to any of the preceding embodiments, comprising the step of adjusting a decrease rate of total activation time per capture interval within the capture sequence.

M65. Method according to any of the preceding embodiments, comprising the step of dividing the capture signal into a set of section signals, wherein each section signal comprises a cohesive subset of the capture signal, and determining a section exposure value for each section signal.

M66. Method according to any of the preceding embodiments, comprising the step of overlapping the cohesive subsets of the capture signal defining the section signals along at least one dimension of the beam signal, preferably spatially overlapping the cohesive subsets by at least 25%, more preferably spatially overlapping the cohesive subsets by at least 50%.

M67. Method according to any of the preceding embodiments, comprising the step of activating the BCD and/or entering the evaluation mode, when a section exposure value for a signal section exceeds a maximum section exposure value.

M68. Method according to any of the preceding embodiments, comprising the step of filtering the capture signal to generate a filtered capture signal.

M69. Method according to any of the preceding embodiments, comprising the step of applying the filter to each section signal, in particular applying the filtering in parallel to all section signals, to generate filtered section signals.

M70. Method according to any of the preceding embodiments, comprising the step of determining an exposure value based on a filtered section signal.

M71. Method according to any of the preceding embodiments, comprising the step of spatially filtering the capture signal to decrease spatial brightness gradients, in particular to smoothen brightness values.

M72. Method according to any of the preceding embodiments, comprising the step of receiving a target capture interval, wherein the target capture interval is free of any active intervals, and/or determining a maximum allowable beam intensity value and/or a maximum exposure value in reference to the target capture interval.

M73. Method according to any of the preceding embodiments, comprising the steps of incrementally increasing the inactive interval per capture interval and/or incrementally decreasing the active interval per capture interval of a capture sequence and/or determining an exposure value for at least one capture interval of the capture sequence or each capture interval of the capture sequence, and/or setting a control interval comprising only an inactive interval, respectively free of an active interval, based on at least one exposure value of a capture interval of the capture sequence.

M74. Method according to any of the preceding embodiments, comprising the step of matching a maximum safe exposure value to a maximum safe capture interval.

M75. Method according to any of the preceding embodiments, comprising the step of determining an optimal safe capture interval.

M76. Method according to any of the preceding embodiments, comprising the step of determining a minimum exposure value and setting a control interval based on the minimum exposure value such that the beam signal is captured and registered within the capture signal above a noise floor of the sensor and/or that a potential increase in exposure value to the maximum safe exposure value is maximized.

M77. Method according to any of the preceding embodiments, comprising the step of capturing the beam signal with a capture rate above a minimum capture rate threshold, in particular to provide a flicker-free, continuously updated capture signal.

M78. Method according to any of the preceding embodiments, comprising the step of adjusting the control interval such that the BCD is activated when a capture interval ends and/or a capture interval begins.

BRIEF DESCRIPTION OF FIGURES

The present invention will now be described with reference to the accompanying drawings, which illustrate embodiments of the invention. These embodiments should only exemplify, but not limit, the present invention.

DETAILED DESCRIPTION OF FIGURES

It is noted that not all the drawings carry all the reference signs. Instead, in some of the drawings, some of the reference signs have been omitted for sake of brevity and simplicity of illustration. Embodiments of the present invention will now be described with reference to the accompanying drawings.

Figure 1:
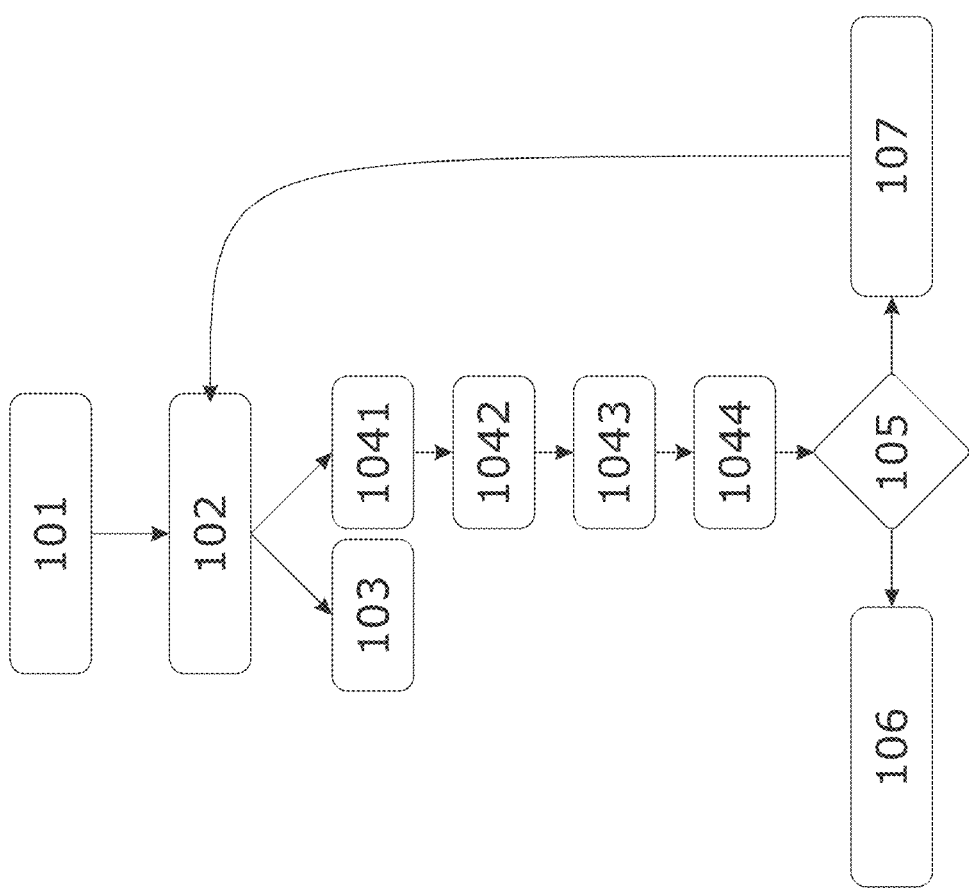
FIG. 1 schematically depicts an embodiment of applying the evaluation mode according to the invention.

FIG. 1 shows a flow chart pertaining to executing the evaluation mode. Once the evaluation mode is triggered the exposure of the sensor is set to a predetermined initial value. In particular, the control interval can comprise a predetermined ratio of an active interval and inactive interval, preferably in reference to the capture interval. For example, the inactive interval can be set to $T=10\,\mu s$ such that for a first capture interval in the evaluation mode the sensor is exposed to the beam signal for the duration of 10 μs. Setting the initial control parameters can be performed in the step 101. Following the setting of the control parameters a reset frame can be acquired in step 102. Acquiring a reset frame can be optional. The reset frame may form a basis for the further evaluation of subsequently captured beam signal exposures. When the initial parameters are set or acquired the BCD can be deactivated, i.e., the shutter can be opened (step 103). Parallel to opening the shutter first capture data can be acquired (step 1041). This data can be an initial data frame, which is preferably not used to evaluate, i.e., quantify, the exposure. Acquisition of the initial data frame 1041 can be optional. A capture interval can comprise the 10 µs window during which the beam signal is exposed to the sensor.

The system can implement a version of Multi Frame Correlated Double Sampling (MFCDS), in particular according to U.S. Pat. No. 8,817,148B2 which is hereby included in its entirety. A reset frame according to the invention can be used to achieve a predetermined state of each pixel of the sensor. CDS can be employed to reduce Fixed Pattern Noise (FPN) and Reset Noise (RN), in particular when the sensor is a CMOS sensor.

Capturing the beam signal 1042 for evaluation of the exposure can provide the basis for evaluating whether a beam intensity peak is captured by the sensor. In particular, the control module can identify whether the beam trajectory coincides with the sensor position in step 1043, i.e., a maximum of the beam signal actually hits the sensor. The control module can implement difference frames to determine the state of exposure of the sensor, i.e., whether the beam signal is captured by the sensor, preferably distinguishing whether the beam signal is captured in part or in full. This can include a compensation of the captured data with dark frames and/or the reset frame. For example, the reset frame E0 can be compensated by a corresponding dark frame D0: E0–D0, and the data frame E2 can also be compensated by a further corresponding dark frame D2: E2–D2. As such, whether the beam is captured by the sensor can be determined based on the difference of (E2–D2)–(E0–D0). The control module can also check this difference for overexposure.

When the beam signal is captured, the exposure can be evaluated 105. The control module can determine safe exposure conditions. When the current exposure value is within safe limits and/or the subsequent settings are predicted to be within safe limits an inactive interval, i.e., a time interval of exposure of the beam signal to the sensor can be increased 107. The exposure interval can be increased by a predetermined factor (e.g., 2).

Based on the evaluated exposure the control module can set an exposure increase higher than the predetermined factor or predetermined increase amount. Thus, when an exposure with the higher value is determined to be below a maximum exposure value an exposure step can be skipped. Preferably, an increase can be measured in duty cycle percentages. For example, the control module can be configured to determine that a 50% duty cycle exposure will generate an exposure value within safe limits based on an exposure value determined from a 2% duty cycle exposure. Thus, the control module can skip incremental increases between 2% and 50% and directly perform a 50% duty cycle exposure subsequent to the 2% duty cycle exposure. Skipping increases can vary based on the precision and confidence values associated with the exposure value determined based on the initial exposure, i.e., the 2% duty cycle exposure.

The evaluation mode can be triggered by an interface of the system and/or by a proactive dose protection mechanism which monitors current exposure values with reference to parameters acceptable to the system, e.g., exposure values within set minimum and/or maximum threshold values. Furthermore, an alteration to the system, e.g., adjusting optics, changing the sample, changing BCD settings can trigger the evaluation mode to again verify that the system operates within predetermined threshold parameters.

When it is determined in step 105 that the current exposure does not fall within predetermined threshold parameters, e.g., the exposure value exceeds a maximum exposure value, the system can issue a report comprising the current parameters, specifically the current exposure interval (e.g., 10 µs). Additionally or alternatively, the control module can revert to a previous set of parameters which were considered safe. These settings can however also be re-evaluated to determine whether these previous parameters are still generating capture data within predetermined threshold parameters. Based on the report an evasive action can be performed, in particular by the control module, when a margin between current exposure value and a threshold value is undercut such that the margin can be increased.

A significant optical mode change can be indicated manually and/or automatically by a subsystem of the system. A significant optical mode change can trigger a switch into the evaluation mode. During evaluation mode the system can determine whether the illumination of the sensor is acceptable or not. The evaluation mode can be a proactive dose protection. Following the evaluation mode a regular exposure mode can be performed during which a reactive dose protection is active, i.e., capturing the beam signal can be interrupted when an overexposure is detected.

Figure 2:
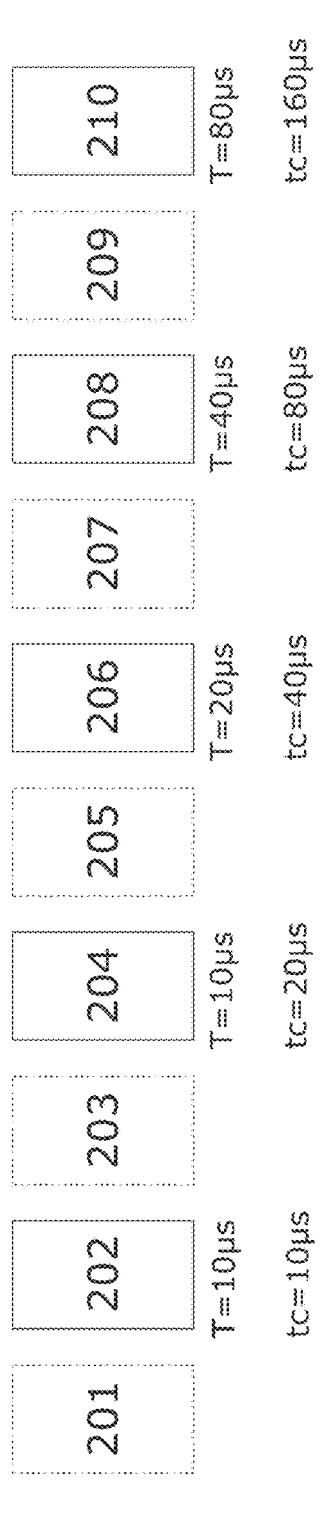
FIG. 2 schematically depicts a sequence of capture intervals according to an embodiment of the invention.

FIG. 2 schematically depicts a sequence of capture intervals according to an embodiment of the invention. Frame 201 can be a reset frame. Each capture frame labeled with an even numeral (202, 204, 206, . . . ) can be split into a set of two frames each, wherein a first frame can correspond to an initial data frame and the second frame can be a detection frame used to determine an exposure of the beam signal. These detection frames are labelled with odd numerals (203, 205, 207, . . . ). tc can correspond to an exposure time interval, i.e., an inactive interval per capture frame during which the beam signal is exposed to the sensor. Correspondingly, T can represent an exposure time increment, in particular with reference to the previously captured frame. For example, an initial capture interval can comprise a beam exposure of tc=10 µs and a subsequent capture interval can comprise a beam exposure of tc=20 µs such that T=10 µs. A minimum number of capture intervals to be evaluated within the evaluation mode can be set. For example, a minimum number of 20 capture intervals, i.e., frames can be set. Additionally or Alternatively, a minimum total exposure time can be set. For example, a minimum total exposure time of 80 ms can be set.

Figure 3:
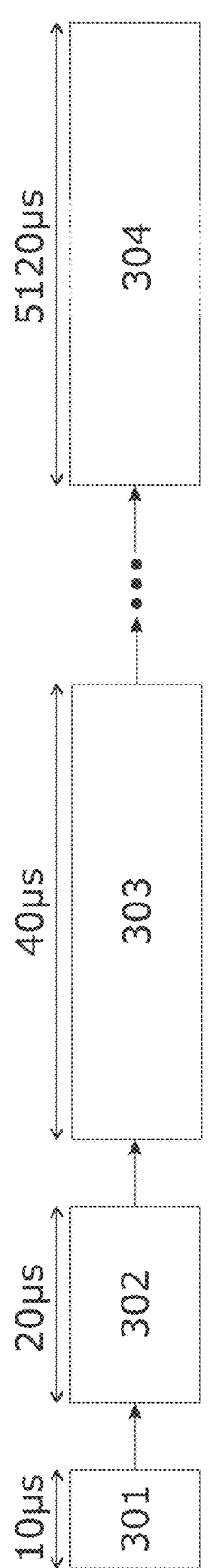
FIG. 3 schematically depicts a further sequence of capture intervals according to an embodiment of the invention.

FIG. 3 schematically depicts a further sequence of capture intervals according to an embodiment of the invention. In particular, the exposure window, i.e., inactive interval during a capture interval can be increased to or exceed the capture interval. For example, a full-length capture interval can be 4000 µs. The inactive interval length can be increased by a constant factor of two, yielding an interval length of 5120 µs. Thus, a final capture interval during the evaluation mode can be characterized by a completely deactivated BCD, i.e., an exposure of the beam signal to the sensor for the full duration of a capture interval. The evaluation mode can test a partial dose to determine and/or predict an exposure with a full dose. For example, a full dose of the beam signal per pixel during a capture interval without the BCD blocking the beam signal can amount to 10 nA per pixel. In conjunction with a minimum exposure time interval, i.e., minimum inactive interval of 10 µs and a maximum lifetime dose per pixel of $1.5*10^9$ A. The sensor can capture approximately 2430 frames with 10 µs exposure windows and an intensity of 10 nA per pixel before reaching its lifetime expectancy. In contrast to a full-length exposure of, e.g., 8 ms the sensor may only be exposed to $1/800^{th}$ of the radiation with a 10 µs exposure window. Furthermore, 10 nA can represent an exceptionally high intensity for one pixel also including diffraction applications. Preferably, the maximum intensity per pixel may be approximately 1 nA.

Figure 4:
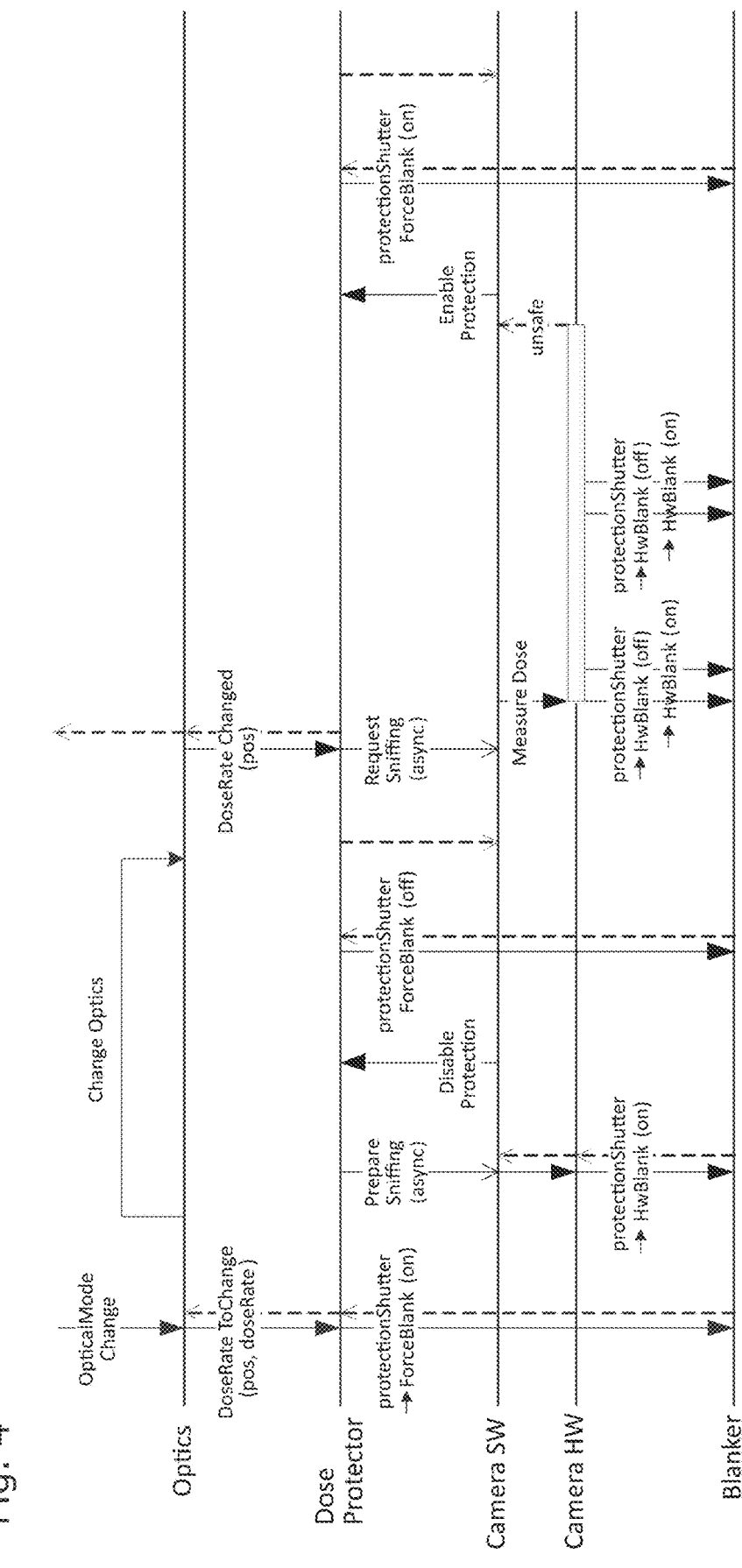
FIG. 4 schematically depicts a control scheme according to an embodiment of the invention.

FIG. 4 schematically depicts a control scheme according to an embodiment of the invention. The diagram is based on a time axis running from left to right, i.e., starting with a trigger signal (e.g., OpticalModeChange). The evaluation mode can be triggered by a specific trigger event or signal. For example, an optical mode change can trigger a dose protection. The optical mode change can include a normalization, change to diffraction, beam stop retract and/or an image shift due to the beams top being inserted, i.e., activated. Enabling the BCD, i.e., protection shutter (Force-Blank (on)) can represent a control interval comprising only an active interval. The dose protection can be initiated based on a dose change. Furthermore, the dose can be unpredictable, e.g., due to changes to the optics. Thus, the BCD can be triggered to prevent the sensor from being exposed to a beam signal with unknown intensity.

The dose protector can be part of the control module. In particular, the dose protector may issue a ForceBlank signal that may supersede any evaluation mode or other control signal pertaining to the activation/deactivation of the BCD. As long as the ForceBlank signal is set to "on", the BCD may remain active and block the beam signal. The Force-Blank signal can also be set to "on" in anticipation of a beam intensity change and/or in anticipation of a trigger event. Control over the BCD can be transferred from a software level to a hardware level. Preferably, this can be performed once the BCD is active based on the ForceBlank signal. In particular, there can be a time interval between activating the BCD based on the ForceBlank signal and an actual change of the beam signal. In the shown embodiment this time interval is indicated by "Change Optics". Preferably, the evaluation mode can be initialized during this time interval.

In preparation of the evaluation mode (prepare sniffing) a hardware blank (HwBlank) signal can be set to "on" representing a further signal instance that pertains to the activation/deactivation of the BCD. However, the HwBlank signal can be issued by the control hardware layer in contrast to the control software layer. Initializing the evaluation mode (sniffing) can be performed asynchronous. Once the HwBlank signal is established, the protection via the dose protector (ForceBlank, software level) can be disabled, i.e., the ForceBlank signal can be set to "off". Sniffing and evaluation mode are used synonymously as sniffing can be defined as capturing the beam signal for only a fraction of the actual exposure interval to be achieved and increasing that fraction incrementally until the requested exposure interval can be met or threshold values of the system are exceeded preventing a further increase.

During the interval between "DoseRate ToChange" and "DoseRate Changed" the beam intensity can be unpredictable. The "DoseRate ToChange" and "DoseRate Changed" signals can be set automatically once a specific beam intensity altering action is completed and/or these signals can be set by a manual interface action.

The "DoseRate Changed" signal can trigger a delay prior to triggering the evaluation mode to allow the optics to settle. The request to start the evaluation mode can be asynchronous. With the request to start the evaluation mode, control can be transferred from the dose protector to the camera software, wherein the actual capture acquisition including the BCD control can be transferred to a hardware level.

When the request to initiate the evaluation mode (sniffing) is issued to the camera software, a dose measuring can in turn be initiated by the camera software. The actual acquisition of a capture interval including the control of the BCD during an acquisition can be controlled by the camera hardware. Measuring the dose can comprise evaluating a plurality of capture intervals and/or deactivating/activating the BCD for a plurality of intervals. The BCD can be deactivated, i.e., an inactive interval can start, when the camera hardware issues a HwBlank signal with the value "off". The BCD can be activated, i.e., an active interval can start and an inactive interval can end, when the camera hardware issues a HwBlank signal with the value "on". Each capture signal can comprise a plurality of active intervals. The process of measuring a dose can be aborted when an unsafe dose is captured by at least one capture interval, i.e., an exposure threshold value is exceeded by at least one pixel or a significant number of pixels. When the current exposure value is considered unsafe to expose the sensor further to the sensor control can be given from the camera software to the dose protector which in turn can issue a forced activation of the BCD by providing the ForceBlank signal with the value "on". Thus, the sensor can be protected from overexposure, respectively high beam intensity.

When the evaluation mode can be completed without a full exposure triggering threshold parameters the evaluation mode (dose measuring) can be completed and regular capturing of the beam signal can proceed.

The control module can be configured to provide a dose margin value indicating a difference between a current exposure value and/or beam intensity and a respective threshold value.

Furthermore, the system can be configured to react to a failure of any component by forcing the BCD to activate and/or trigger the secondary BCD should also the primary BCD fail. The control module can identify a failed component or generally a fail state of the system based on the beam intensity and/or beam intensity pattern (temporal and/or spatial) at the sensor. When the beam signal deviates from an expected range of parameters the control module can trigger the BCD to protect the sensor. For example, should a significant dose be detected despite of a beam blank signal being active (on) a failure can be detected. The control module can detect a failure in any component (e.g., optics, BCD position, . . . ). Detecting a failure can also trigger the evaluation mode.

Figures 5, 6:
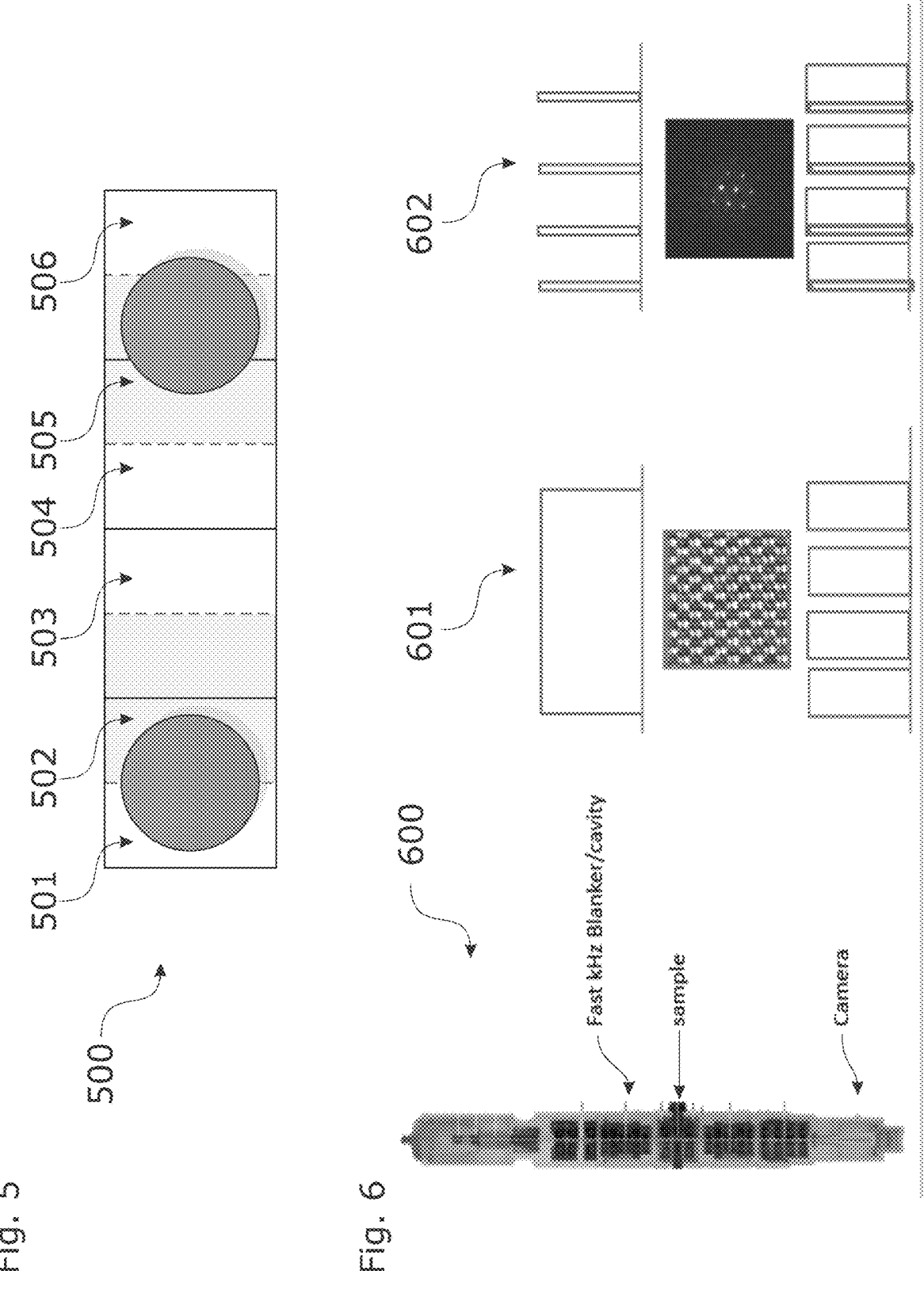
FIG. 5 schematically depicts a plurality of overlapping section signals according to an embodiment of the invention.
FIG. 6 schematically depicts a capture sequence and imaging device according to an embodiment of the invention.

FIG. 5 shows a schematic sequence 500 of overlapping section signals 50 #, where #represents a positive integer. In particular, the sections overlap by 50% such that each sensor section is represented as part of two separate section signals. An exemplary beam signal is shown as two circles. Thus, a first circle is captured in full by the section signal 501 and in part by section signal 502, wherein the first circle is not part of section signal 503. Due to the overlap the probability of splitting the beam signal at section signal edges can be reduced, i.e., the chance that at least one section captures the beam signal without intersecting a section edge can be increased. Capturing the complete beam signal, or at least a cohesive domain of the beam signal within a single section signal can increase the accuracy of the determined exposure value of the respective section signal. When the beam signal is split over a plurality of section signals the exposure value generated for each section signal may not trigger an exposure threshold as each section may not comprise a significant portion of the beam signal to trigger a brightness warning for that respective section signal. The overlap can be performed in two or more directions, i.e., transversely, laterally and/or diagonally. The Overlap can be altered according to the type of expected beam signal and the likelihood that a relevant cohesive part of the beam signal may be split across section signals.

The secondary circle is partly captured by the section signal 504,505 and 506*l*. None of the section signals fully captures the secondary circle. However, due to the sectioning, the section signal 505 is a close approximation of a section that would have fully enclosed the secondary circle. The control module can be configured to determine an exposure value for section 505 and can weight the exposure value based on exposure values determined for section 504 and/or 506, i.e., neighboring sections capturing the same cohesive beam signal part to estimate a true exposure value which would correspond to a section signal fully capturing the secondary circle. Consequently, overlapping sections allow for a more precise determination of an exposure, thus increase the probability to avoid sensor damage due to an undetected overexposure.

FIG. 6 depicts a schematic representation of a continuous exposure in imaging 601. Here the beam signal is continuously exposed to the sensor. The sensor captures the beam signal in segmented capture intervals. Exposure time is equivalent to the capture interval length.

FIG. 6 further depicts a schematic representation of a pulsed exposure in diffraction 602. Here the exposure time is controlled by the BCD. Each capture interval comprises an exposure interval based on the BCD being inactive at the beginning of each capture interval (frame). Typically, the diffraction image can comprise significantly higher beam intensities compared to the reflective continuous imaging. Due to the spot-like intensity peaks it is essential to accurately detect the brightness of these spots to increase sensor protection and longevity.

The system 600 can comprise a BCD (e.g., beam blanker, cavity, etc.) to expose the sample (e.g., for an exposure duration equal to or below 1 ms) and a sensor providing a frame rate of 20 fps or higher. For example, the sensor can be read out with a readout frequency of 25 Hz and the exposure interval of the sample can be based on an exposure frequency of 1 khz the dose can be reduced by a factor of 40. With an exposure frequency of 10 khz a reduction by a factor of 400 can be achieved.

For example, 10-1000 pA of current can be used in MS imaging. When in average of 100.000 pixels are illuminated on a $16*10^6$ pixel sensor, this can average approximately 1-100 pe/pixel per 25 fps. A readout frequency of 25 fps or above can result in a smooth observation of changes of the diffraction pattern for an operator. Lower readout frequencies can cause a jitter effect, which can be tiring for the operator.

The diffraction pattern 602 of Si110 can comprise intensities in the diffraction spots in the order of 100-600 counts which can equal 5-30 primary electrons. In this dose range the misorientation of the crystal is observable. The exposure time can be 3.3 ms, respectively 300 fps with 1 pA current. A smooth live image can be achieved by reducing the dose for orientation by a factor of 10.

Figure 7:
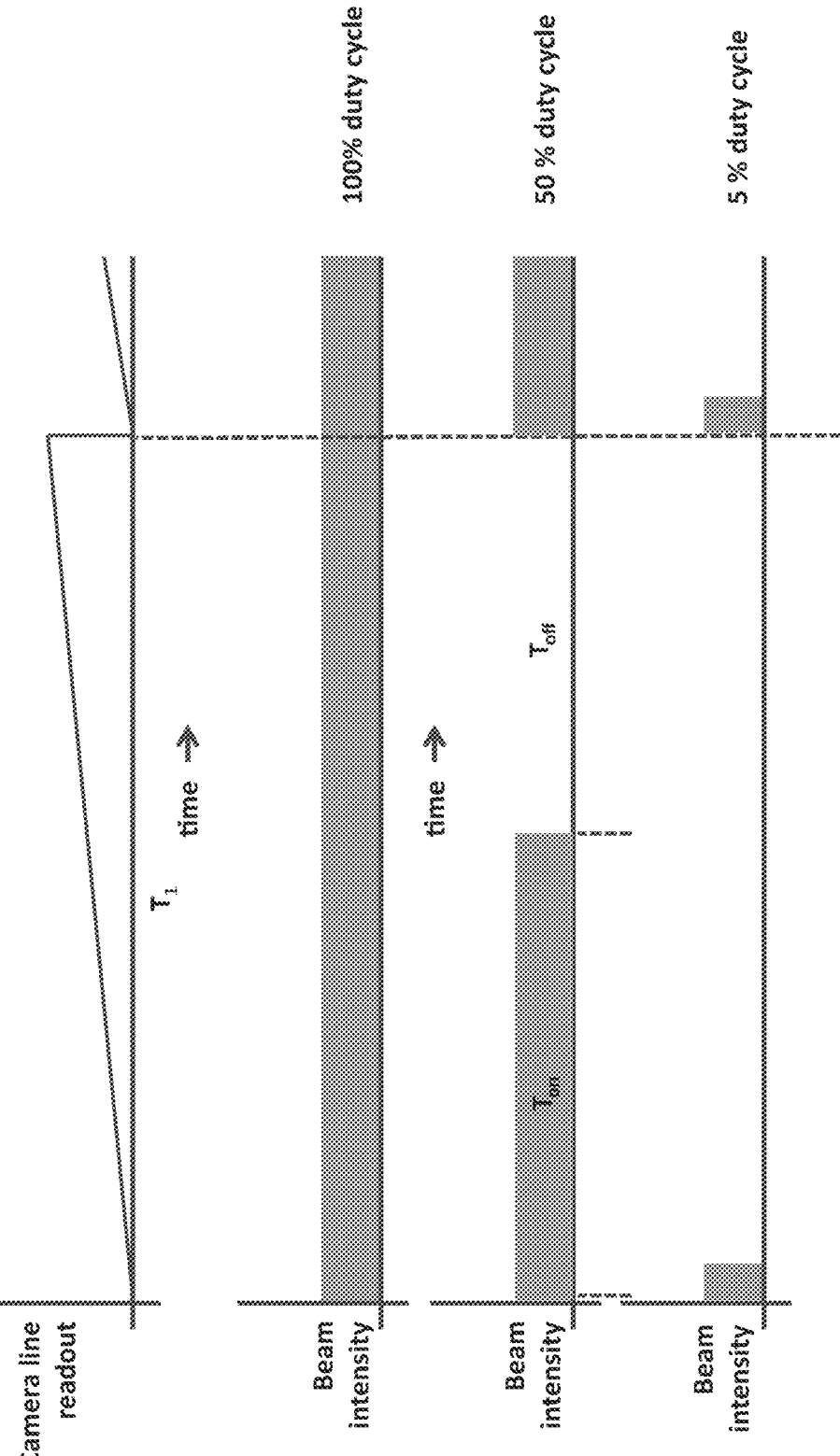
FIG. 7 schematically depicts the relation of BCD status, beam intensity and sensor read-out for a plurality of PWM-parameters according to an embodiment of the invention.

FIG. 7 depicts four stacked diagrams which share a common x-axis indicating time. The top most graph represents camera line readout progression. Thus, $T_1$ indicates the time interval during which the sensor completes the readout of all lines, i.e., a complete frame. Camera readout speed can be linear. The second graph indicates the beam intensity to which the sensor is exposed during the capture interval $T_1$ with a duty cycle of 100%. The duty cycle can relate to a PWM actuation of the BCD. Herein a 100% duty cycle can relate to the BCD being inactive for a complete capture interval. Thus, the beam signal is exposed in full intensity for the full duration of a capture interval. It is further indicated, that a 100% duty cycle can correspond to the BCD being inactive for a series of subsequent frames, as no active interval for the BCD is present in the control signal.

Alternatively, the control module can implement a 50% duty cycle PWM such that during half of the capture interval the BCD is inactive and during the other half of the capture interval the BCD is active. The specific example shows one cohesive inactive interval $t_{on}$ specifically at the beginning of each capture interval and one cohesive active interval $t_{off}$ specifically at the end of each capture interval.

Furthermore, the control module can implement a 5% duty cycle PWM such that the BCD is inactive for 5% of the capture interval, specifically at the beginning of the capture interval.

Figure 8:
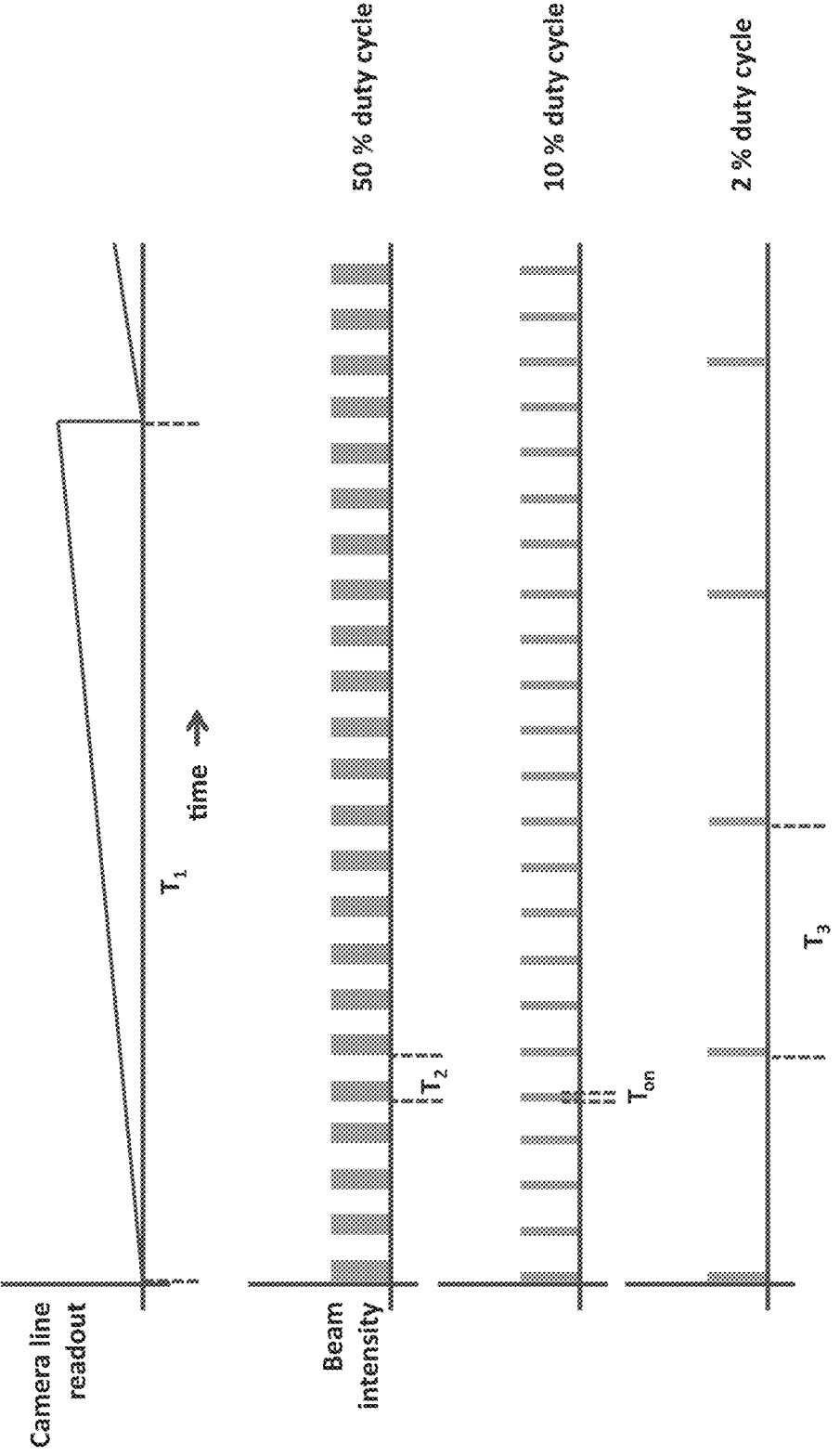
FIG. 8 schematically depicts the relation of BCD status, beam intensity and sensor read-out for a plurality of selected PWM-parameters according to an embodiment of the invention.

FIG. 8 schematically depicts further embodiments of interval sequences according to the invention. $T_1$ corresponds to a capture interval during which a full readout of the sensor can be performed. A full readout can be defined as transmitting a single exposure from the sensor. The sensor can capture a plurality of exposures which can then be read sequentially from the sensor. Alternatively to the 50% PWM duty cycle embodiment shown in FIG. 7, the 50% PWM duty cycle can be spread over the capture interval according to a predetermined PWM frequency. The PWM frequency can be determined by a PWM period $T_2$. The interval $T_2$ can comprise a PWM pattern that is repeated within the capture interval. Preferably, the capture interval is a multiple of the interval $T_2$. The interval $T_2$ may comprise an active interval and an inactive interval. In particular, $T_2$ can comprise an active interval and an inactive interval which have the same duration corresponding to a 50% PWM duty cycle.

Furthermore, FIG. 8 shows a 10% PWM duty cycle that is spread over one capture interval. Herein, $T_{on}$ accounts for 10% of one PWM period $T_2$. Thus, the 10% PWM duty cycle embodiment has the same PWM frequency as the 50% PWM duty cycle embodiment. Preferably, a capture interval and/or PWM interval begins with an inactive interval, i.e., the beam signal is exposed to the sensor at the beginning of each capture interval. The total sum of $T_{on}$ intervals over one capture interval can amount to the respective percentage of the capture interval, i.e., with a 10% PWM duty cycle, 10% of the capture interval can be inactive intervals.

FIG. 8 also shows a 2% PWM duty cycle embodiment. The PWM frequency is based on the PWM interval $T_3$. Here, the capture frequency is not an integer multiple of the PWM frequency such that the PWM modulation is asynchronous to the capture interval. Furthermore, the duty cycle interval $T_{on}$ can be identical to $T_{on}$ of the 10% PWM duty cycle embodiment. When a minimum inactive interval is reached a further reduction in exposure can be achieved by keeping the duty cycle interval $T_{on}$ constant and decreasing the PWM frequency, respective increasing the PWM interval.

The invention claimed is:

1. A system for sensor protection in electron imaging applications comprising:

a beam control device (BCD) operable to provide a beam signal based on an incoming beam signal, wherein the beam signal comprises an altered beam intensity, wherein the BCD is further operable to receive a control signal and to activate based on the control signal, a sensor operable to capture the beam signal and to provide a capture signal based on the beam signal, and a control module operable to provide the control signal to the BCD, to generate an exposure value based on the capture signal and to modify the control signal based on the exposure value, wherein the BCD is operable to activate for the duration of an active interval, and wherein the sensor is operable to provide a spatially resolved representation of the beam signal as part of the capture signal.

2. The System according to claim 1, wherein the control module is operable to decrease the active interval while the exposure value does not exceed an upper threshold value.

3. The system according to claim 1, wherein the control module is operable to enter an evaluation mode when the control module receives a trigger signal, to set a control interval comprising a predetermined maximum active interval, and to incrementally decrease the active interval per capture interval for a subsequent series of capture intervals.

4. The system according to claim 1, wherein the control signal comprises a control interval having the active interval, and wherein the control module is operable to apply a pulse width modulation to the control interval to control an averaged beam intensity of the modified beam signal during the control interval.

5. The system according to claim 1, wherein the control module is operable to determine an increase of the exposure value per capture interval with reference to a previous capture interval.

6. The system according to claim 3, wherein the control module is operable to exit the evaluation mode when at least one of the following conditions is met:

a captured exposure value falls below a maximum safe exposure value and the control interval comprises a predetermined ratio of active intervals to inactive intervals of the BCD;

a difference of the current exposure value and the maximum safe exposure value is smaller than a projected increase of the exposure value in a subsequent capture interval;

the control interval comprises an inactive interval only.

7. The system according to claim 6, wherein the control module is operable to control the exposure value of a subsequent capture interval to an exposure value determined in the evaluation mode.

8. The system according to claim 1, wherein the control module is operable to decrease the active interval such that the exposure value is increased according to a predetermined relation per capture interval.

9. The system according to claim 4, wherein the control module is operable to predict an exposure value for a selected capture interval of a sequence of subsequent capture intervals based on the exposure value of a previous capture interval, determine if the exposure value is smaller or equal to a maximum safe exposure value, and to set the control interval of the subsequent capture interval based on the control interval of the selected capture interval and wherein the selected capture interval is at a second position or higher of the sequence of subsequent capture intervals.

10. The system according to claim 1, wherein the control module is operable to predict an exposure value for each capture interval in a capture sequence comprising a series of subsequent capture intervals, and wherein a total activation time corresponding to a summed duration of active intervals per capture interval decreases for consecutive capture intervals within the capture sequence.

11. The system according to claim 1, wherein the control module is operable to divide the capture signal into a set of section signals, wherein each section signal comprises a cohesive subset of the capture signal, and to determine a section exposure value for each section signal, and to overlap the cohesive subsets of the capture signal defining the section signals along at least one dimension of the beam signal, and to activate the BCD, when a section exposure value for a signal section exceeds a maximum section exposure value.

12. The system according to claim 1, wherein the control module is operable to spatially filter the capture signal to decrease spatial brightness gradients.

13. The system according to claim 4, wherein the control module is operable to receive a target capture interval, wherein the target capture interval is free of any active intervals, and/or wherein the control module is further operable to determine a maximum allowable beam intensity value and/or a maximum exposure value in reference to the target capture interval, and to incrementally decrease the active interval per capture interval of a capture sequence, and to determine an exposure value for at least one capture interval of the capture sequence, and to set a control interval free of an active interval based on at least one exposure value of a capture interval of the capture sequence.

14. A method for sensor protection in electron imaging applications comprising the steps of providing a modified beam signal based on an incoming beam signal, by varying an intensity of the modified beam signal over a predetermined time interval;

capturing the modified beam signal and providing a capture signal based on the captured beam signal;

generating an exposure value based on the capture signal and modifying a control signal based on the exposure value, wherein the control signal comprises a control interval having an active interval;

increasing the active interval of the control signal when the exposure value exceeds an upper threshold value; and providing a spatially resolved representation of the beam signal as part of the capture signal.

15. The method according to claim 14, comprising the steps of entering an evaluation mode when receiving a trigger signal;

setting a control interval corresponding to a predetermined exposure value;

incrementally decreasing the active interval per capture interval in the evaluation mode; and exiting the evaluation mode when a captured exposure value falls below a maximum safe exposure value and the control interval comprises a predetermined active interval.

16. A system for sensor protection in electron imaging applications comprising:

a beam control device (BCD) operable to provide a beam signal based on an incoming beam signal, wherein the beam signal comprises an altered beam intensity, wherein the BCD is further operable to receive a control signal and to activate based on the control signal, a sensor operable to capture the beam signal and to provide a capture signal based on the beam signal, and a control module operable to provide the control signal to the BCD, to generate an exposure value based on the capture signal and to modify the control signal based on the exposure value, and perform at least one selected from a group consisting of:

determine an increase of the exposure value per capture interval with reference to a previous capture interval, and spatially filter the capture signal to decrease spatial brightness gradients.

17. The system according to claim 16, wherein the control module is operable to enter an evaluation mode when the control module receives a trigger signal, to set a control interval comprising a predetermined maximum active interval, and to incrementally decrease the active interval per capture interval for a subsequent series of capture intervals.

18. The system according to claim 16, wherein the control signal comprises a control interval having the active interval, and wherein the control module is operable to apply a pulse width modulation to the control interval to control an averaged beam intensity of the modified beam signal during the control interval.

19. The system according to claim 16, wherein the control module is operable to determine an increase of the exposure value per capture interval with reference to a previous capture interval.

20. The system according to claim 16, wherein the control module is operable to decrease the active interval such that the exposure value is increased according to a predetermined relation per capture interval.

* * * * *